(12) United States Patent
Jeong et al.

(10) Patent No.: US 9,553,607 B2
(45) Date of Patent: Jan. 24, 2017

(54) TRANSMITTING APPARATUS, RECEIVING APPARATUS, AND SIGNAL PROCESSING METHOD THEREOF

(71) Applicant: SAMSUNG ELECTRONICS CO., LTD., Suwon-si (KR)

(72) Inventors: Hong-sil Jeong, Suwon-si (KR); Se-ho Myung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 14/480,843

(22) Filed: Sep. 9, 2014

(65) Prior Publication Data

US 2015/0089320 A1    Mar. 26, 2015

(30) Foreign Application Priority Data

Sep. 26, 2013   (KR) ................ 10-2013-0114787

(51) Int. Cl.
| | |
|---|---|
| *H03M 13/00* | (2006.01) |
| *H03M 13/11* | (2006.01) |
| *H03M 13/25* | (2006.01) |
| *H03M 13/27* | (2006.01) |
| *H03M 13/29* | (2006.01) |
| *H03M 13/35* | (2006.01) |
| *H04L 1/00* | (2006.01) |
| *H03M 13/15* | (2006.01) |

(52) U.S. Cl.
CPC ....... *H03M 13/1165* (2013.01); *H03M 13/255* (2013.01); *H03M 13/2707* (2013.01); *H03M 13/2906* (2013.01); *H03M 13/356* (2013.01); *H03M 13/618* (2013.01); *H03M 13/6362* (2013.01); *H03M 13/6393* (2013.01); *H04L 1/00* (2013.01); *H03M 13/152* (2013.01)

(58) Field of Classification Search
CPC .. H03M 13/1165; H03M 13/152; G06F 11/10; H04L 1/0071
See application file for complete search history.

(56) References Cited

U.S. PATENT DOCUMENTS

| | | | | |
|---|---|---|---|---|
| 6,594,228 | B1 * | 7/2003 | Naidoo | H04L 49/3081 370/217 |
| 7,861,134 | B2 * | 12/2010 | Kose | H03M 13/1102 714/755 |
| 8,121,017 | B2 * | 2/2012 | Stadelmeier | H04N 21/4385 370/203 |
| 8,503,551 | B2 * | 8/2013 | Ko | H04L 1/0041 341/173 |

(Continued)

OTHER PUBLICATIONS

International Search Report dated Dec. 30, 2014 issued by International Searching Authority in counterpart International Application No. PCT/KR2014/009044.

(Continued)

*Primary Examiner* — Esaw Abraham
(74) *Attorney, Agent, or Firm* — Sughrue Mion, PLLC

(57) ABSTRACT

A transmitting apparatus is provided. The transmitting apparatus includes a segmenter configured to segment Layer 1 (L1) signaling; and an encoder configured to perform Low-Density Parity Check (LDPC) encoding with respect to each of the segmented L1 signalings, and the encoder punctures parity bits from LDPC parity bits added by the LDPC encoding as many as bits of a predetermined group unit.

14 Claims, 21 Drawing Sheets

(56) References Cited

U.S. PATENT DOCUMENTS

| | | | | |
|---|---|---|---|---|
| 8,897,253 B2* | 11/2014 | Shin | ................ | H04L 5/001 |
| | | | | 370/329 |
| 9,009,775 B2* | 4/2015 | Ko | ................ | H03M 13/251 |
| | | | | 725/146 |
| 9,021,341 B1* | 4/2015 | Srinivasa | ............ | H04L 1/0061 |
| | | | | 714/776 |
| 9,172,497 B2* | 10/2015 | Shinya | ................ | H04L 1/0057 |
| 9,264,272 B2* | 2/2016 | Stadelmeier | ........ | H04L 27/2602 |
| 2007/0113147 A1 | 5/2007 | Hong et al. | | |
| 2010/0085985 A1 | 4/2010 | Pekonen et al. | | |
| 2010/0226426 A1 | 9/2010 | Tupala et al. | | |
| 2011/0299628 A1* | 12/2011 | Ko | ................ | H04L 1/0044 |
| | | | | 375/298 |
| 2012/0243600 A1 | 9/2012 | Jeong et al. | | |
| 2012/0300690 A1 | 11/2012 | Vare et al. | | |
| 2013/0272448 A1* | 10/2013 | Moon | ................ | H04B 7/0413 |
| | | | | 375/298 |
| 2014/0229801 A1* | 8/2014 | Eroz | ................ | H04L 1/0057 |
| | | | | 714/776 |

OTHER PUBLICATIONS

Written Opinion dated Dec. 30, 2014 issued by International Searching Authority in counterpart International Patent Application No. PCT/KR2014/009044.

* cited by examiner

TRANSMITTING APPARATUS, RECEIVING APPARATUS, AND SIGNAL PROCESSING METHOD THEREOF

CROSS-REFERENCE TO RELATED APPLICATION

This application claims the benefit under 35 U.S.C. §119 (a) of a Korean patent application filed on Sep. 26, 2013 in the Korean Intellectual Property Office and assigned Serial No. 10-2013-0114787, the entire disclosure of which is hereby incorporated by reference.

TECHNICAL FIELD

Apparatuses and methods consistent with exemplary embodiments relate to a transmitting apparatus, a receiving apparatus, and a signal processing method thereof, and more particularly, to a transmitting apparatus which processes a signal and transmits the signal, a receiving apparatus, and a signal processing method thereof.

BACKGROUND

In the information-oriented society of the $21^{st}$ century, broadcasting communication services are entering the era of digitization, multi-channel, broadband, and high quality. In particular, as high-quality digital television (TV), portable multimedia player (PMP), and portable broadcasting apparatuses have been increasingly used in recent years, there is an increasing demand for digital broadcasting services that are able to support various receiving methods.

Digital Video Broadcasting-Terrestrial version 2 (DVB-T2) is the terrestrial digital broadcasting standard that was established to improve performances of the DVB-T in the DVB group to live up to such a demand. The DVB-T2 increases transmission efficiency while maintaining compatibility with the DVB-T, and adopts MPEG-4 Advanced Video Coding (AVC) as a compression method, adds 256-Quadrature Amplitude Modulation (QAM) to an existing modulation method, adds 1K, 4K, 16K, and 32K to the transmission mode, and adopts Low-Density Parity-Check (LDPC) codes of high efficiency for Forward Error Correction (FEC).

There is a need for a method for transmitting signals more effectively using the DVB-T2 standard described above.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a transmitting apparatus and a receiving apparatus, which can improve decoding performance at a receiving side when LDPC encoding is performed, and a signal processing method thereof.

One or more exemplary embodiments also provide a transmitting apparatus and a receiving apparatus, which demultiplex an LDPC codeword into a cell word to improve performance, and a signal processing method.

According to an aspect of an exemplary embodiment, there is provided a transmitting apparatus including: a segmenter configured to segment Layer 1 (L1) signaling; and an encoder configured to perform Low-Density Parity-Check (LDPC) encoding with respect to each of the segmented L1 signalings, wherein the encoder punctures as many parity bits from LDPC parity bits added by the LDPC encoding as bits of a predetermined group unit.

In response to the LDPC parity bits being grouped by a predetermined criterion, the predetermined group unit may be an integer multiple of a number of LDPC parity bits included in each group.

The predetermined criterion may be determined according to a constant corresponding to an LDPC code rate.

The encoder may calculate a number of the bits of the predetermined group unit to be punctured using a following equation:

$$N_{punc} = \left\lfloor \frac{A \times (K_{bch} - K_{sig}) + B}{M} \right\rfloor \times M,$$

where $N_{punc}$ is the number of bits of the predetermined group unit, A is a ratio between a number of bits to be shortened and a number of bits to be punctured, B is a correction value, M is a number of LDPC parity bits included in the each group, $K_{bch}$ is a length of an information word in Bose, Chaudhuri, Hocquenghem (BCH) encoding if the BCH encoding is performed prior to the LDPC encoding, and $K_{sig}$ is a length of the segmented L1 signaling.

The encoder may add zero-value bits to the segmented L1 signaling so that the L1 signaling has a length encodable by the encoder, and may encode the L1 signaling to which the zero-value bits are added.

The transmitting apparatus may further include: a bit inserter configured to add zero-value bits to the encoded L1 signaling; and a bit interleaver configured to bit-interleave the L1 signaling to which the zero-value bits are added.

The bit inserter may add the zero-value bits so that the length of the encoded L1 signaling is an integer multiple of a number of columns constituting the bit interleaver, and may output the L1 signaling to which the zero-value bits are added to the bit interleaver.

The bit inserter may calculate a number of zero-value bits to be added using a following equation:

$$N_{PAD} = \left\lceil \frac{K_{sig} + P_{bch} + P_{ldpc} - N_{punc}}{N_c} \right\rceil \times N_c - (K_{sig} + P_{bch} + P_{ldpc} - N_{punc}),$$

where $N_c$ is a number of columns of the bit interleaver, $K_{sig}$ is a length of an information word in the BCH encoding if the BCH encoding is performed prior to the LDPC encoding, $P_{bch}$ is a number of BCH parity bits added by the BCH encoding, $P_{ldpc}$ is a number of LDPC parity bits added by the LDPC encoding, and $N_{punc}$ is a number of punctured LDPC parity bits.

According to an aspect of another exemplary embodiment, there is provided a transmitting apparatus including: an encoder configured to perform LDPC encoding with respect to L1 signaling and generate an LDPC codeword; a bit interleaver configured to interleave the LDPC codeword on a bit basis; a demultiplexer configured to demultiplex the bit-interleaved LDPC codeword into a cell word; and a constellation mapper configured to map the cell word onto a constellation point.

The demultiplexer may demultiplex the bit-interleaved LDPC codeword into the cell word, considering characteristics of the LDPC encoding and a modulation symbol corresponding to the constellation point.

The cell word may include bits constituting the modulation symbol, and the demultiplexer may demultiplex the bit-interleaved LDPC codeword into the cell word so that a selected bit from among a plurality of bits constituting the bit-interleaved LDPC codeword, according to the characteristics of the LDCP encoding, is mapped onto a bit constituting the modulation symbol according to a detecting ability of the bit constituting the modulation symbol.

The selected bit is a bit that is located relatively at a front end of a plurality of bits constituting the LDPC codeword, and may be written on a column located relatively at a front end of a plurality of columns constituting the bit interleaver.

The demultiplexer may demultiplex the bit-interleaved LDPC codeword into the cell word so that the selected bit is mapped onto a bit, among bits constituting the modulation symbol, that determines signs of a real number part and an imaginary number part of the constellation point onto which the modulation symbol is mapped.

The demultiplexer may determine the cell word in which each of bits constituting the bit-interleaved LDPC codeword is demultiplexed according to a modulation method using a following table:

| Modulation format | | | QPSK | | | | |
|---|---|---|---|---|---|---|---|
| input bit-number di mod N | | | 0 | 1 | | | |
| Output bit-number, e | | | 0 | 1 | | | |
| Modulation format | | | 16-QAM | | | | |
| Input bit-number, di mod N | | 0 | 1 | 2 | 3 | | |
| Output bit-number, e | | 0 | 2 | 3 | 1 | | |
| Modulation format | | | 64-QAM | | | | |
| Input bit-number, di mod N | 0 | 1 | 2 | 3 | 4 | 5 | |
| Output bit-number, e | 0 | 3 | 1 | 5 | 2 | 4 | |
| Modulation format | | | 256-QAM | | | | |
| Input bit-number, di mod N | 0 | 1 | 2 | 3 | 4 | 5 | 6 | 7 |
| Output bit-number, e | 0 | 4 | 6 | 1 | 7 | 3 | 5 | 2 | where the input bit number is an index of each of the bits constituting the bit-interleaved LDPC codeword, and the output bit number is an index of each of bits constituting the cell word.

According to an aspect of still another exemplary embodiment, there is provided a method for processing signals of a transmitting apparatus, the method including: segmenting L1 signaling; and performing BCH and LDPC encoding with respect to each of the segmented L1 signalings, wherein the performing the encoding includes puncturing as many parity bits from LDPC parity bits added by the LDPC encoding as bits of a predetermined group unit.

In response to the LDPC parity bits being grouped by a predetermined criterion, the predetermined group unit may be an integer multiple of a number of LDPC parity bits included in each group.

The predetermined criterion may be determined according to a constant corresponding to an LDPC code rate.

The performing the encoding may include calculating a number of the bits of the predetermined group unit to be punctured using a following equation:

$$N_{punc} = \left\lfloor \frac{A \times (K_{bch} - K_{sig}) + B}{M} \right\rfloor \times M,$$

where $N_{punc}$ is the number of bits of the predetermined group unit, A is a ratio between a number of bits to be shortened and a number of bits to be punctured, B is a correction value, M is a number of LDPC parity bits included in each group, $K_{bch}$ is a length of an information word in the BCH encoding if the BCH encoding is performed prior to the LDPC encoding, and $K_{sig}$ is a length of the segmented L1 signaling.

The performing the encoding may include adding zero-value bits to the segmented L1 signaling so that the L1 signaling has an encodable length, and encoding the L1 signaling to which the zero-value bits are added.

The method may further include: adding zero-value bits to the encoded L1 signaling; and bit-interleaving the L1 signaling to which the zero-value bits are added using a bit interleaver.

The adding the zero-value bits may include adding the zero-value bits so that a length of the encoded L1 signaling is an integer multiple of a number of columns constituting the bit interleaver.

The adding the zero-value bits may include calculating a number of zero-value bits to be added using a following equation:

$$N_{PAD} = \left\lceil \frac{K_{sig} + P_{bch} + P_{ldpc} - N_{punc}}{N_c} \right\rceil \times N_c - (K_{sig} + P_{bch} + P_{ldpc} - N_{punc}),$$

where $N_c$ is a number of columns of the bit interleaver, $K_{sig}$ is a length of an information word in the BCH encoding if the BCH encoding is performed prior to the LDPC encoding, $P_{bch}$ is a number of BCH parity bits added by the BCH encoding, $P_{ldpc}$ is a number of LDPC parity bits added by the LDPC encoding, and $N_{punc}$ is a number of punctured LDPC parity bits.

According to an aspect of still another exemplary embodiment, there is provided a method for processing signals of a transmitting apparatus, the method including: performing LDPC encoding with respect to L1 signaling and generating an LDPC codeword; interleaving the LDPC codeword on a bit basis; demultiplexing the bit-interleaved LDPC codeword into a cell word; and mapping the cell word onto a constellation point.

The demultiplexing may include demultiplexing the bit-interleaved LDPC codeword into the cell word, considering characteristics of the LDPC encoding and a modulation symbol corresponding to the constellation point.

The cell word may include bits constituting the modulation symbol, and the demultiplexing may include demultiplexing the bit-interleaved LDPC codeword into the cell word so that a selected bit from among the bits constituting the bit-interleaved LDPC codeword, according to the characteristics of the LDCP encoding, is mapped onto a bit constituting the modulation symbol according to a detecting ability of the bit constituting the modulation symbol.

The interleaving may be performed using a bit interleaver, and the selected bit is a bit that is located relatively at a front end from among the plurality of bits constituting the LDPC codeword, and may be written on a column located relatively at a front end of a plurality of columns constituting the bit interleaver.

The demultiplexing may include demultiplexing the bit-interleaved LDPC codeword into the cell word so that the selected bit is mapped onto a bit, among the bits constituting the modulation symbol, that determines signs of a real number part and an imaginary number part of the constellation point onto which the modulation symbol is mapped.

The demultiplexing may include determining a cell word in which each of the bits constituting the bit-interleaved LDPC codeword is demultiplexed according to a modulation method using a following table:

| Modulation format       | QPSK |   |   |   |   |   |   |   |
|-------------------------|------|---|---|---|---|---|---|---|
| input bit-number, $d_i$ mod N | 0 | 1 |   |   |   |   |   |   |
| Output bit-number, e    | 0    | 1 |   |   |   |   |   |   |
| Modulation format       | 16-QAM |   |   |   |   |   |   |   |
| Input bit-number, $d_i$ mod N | 0 | 1 | 2 | 3 |   |   |   |   |
| Output bit-number, e    | 0 | 2 | 3 | 1 |   |   |   |   |
| Modulation format       | 64-QAM |   |   |   |   |   |   |   |
| Input bit-number, $d_i$ mod N | 0 | 1 | 2 | 3 | 4 | 5 |   |   |
| Output bit-number, e    | 0 | 3 | 1 | 5 | 2 | 4 |   |   |
| Modulation format       | 256-QAM |   |   |   |   |   |   |   |
| Input bit-number, $d_i$ mod N | 0 | 1 | 2 | 3 | 4 | 5 | 6 | 7 |
| Output bit-number, e    | 0 | 4 | 6 | 1 | 7 | 3 | 5 | 2, | where the input bit number is an index of each of the bits constituting the bit-interleaved LDPC codeword, and the output bit number is an index of each of bits constituting the cell word.

According to an aspect of still another exemplary embodiment, there is provided a receiving apparatus which receives a signal from a transmitting apparatus and processes the signal, the receiving apparatus including: a decoder configured to perform decoding using a value corresponding to an LDPC codeword; and a desegmenter configured to desegment segmented L1 signaling which is generated by the decoding, wherein the decoder inserts corresponding values to bits that are punctured on a basis of a predetermined group unit by the transmitting apparatus.

According to an aspect of still another exemplary embodiment, there is provided a receiving apparatus which receives a signal from a transmitting apparatus and processes the signal, the receiving apparatus including: a demodulator configured to demodulate the received signal and generate a value corresponding to an LDPC codeword; a multiplexer configured to multiplex the value corresponding to the LDPC codeword; a bit deinterleaver configured to deinterleave the value corresponding to the LDPC code word, which is multiplexed; and a decoder configured to perform decoding using the value corresponding to the LDPC codeword, which is deinterleaved.

According to the various exemplary embodiments described above, receiving performance can be improved.

BRIEF DESCRIPTION OF THE DRAWINGS

The above and/or other aspects will be more apparent by describing in detail exemplary embodiments, with reference to the accompanying drawings, in which.

DETAILED DESCRIPTION

Figure 1:
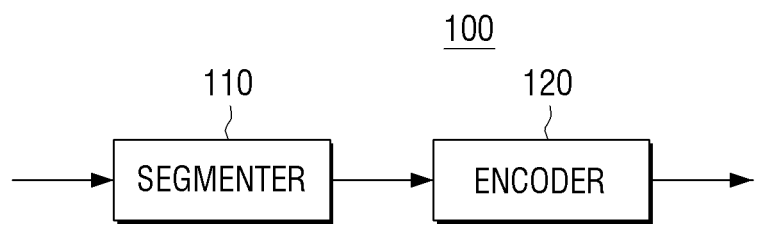
FIG. 1 is a block diagram to illustrate a configuration of a transmitting apparatus according to an exemplary embodiment.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

FIG. 1 is a block diagram to illustrate a configuration of a transmitting apparatus according to an exemplary embodiment. Referring to FIG. 1, a transmitting apparatus 100 includes a segmenter 110 and an encoder 120.

The transmitting apparatus 100 may include all or some of the elements defined by the Digital-Video Broadcasting-Terrestrial version 2 (DVB-T2) standard, and more particularly, may include an element for processing L1 signaling defined by the DVB-T2 standard.

According to the DVB-T2 standard, a data symbol and a preamble symbol are transmitted and received through a frame structure.

The data symbol is transmitted through Physical Layer Pipes (PLPs). Specifically, one service (for example, a broadcasting service) may be transmitted through one PLP and service components constituting one service (for example, video, audio, etc.) may be divided and transmitted through different PLPs.

The preamble symbol consists of a P1 symbol and at least one P2 symbol.

P1 signaling transmitted by the P1 symbol includes a transmission type and basic transmission parameters. To achieve this, the P1 signaling includes an S1 field and an S2 field.

The S1 field signals a preamble format. For example, when an S1 field value is 000, the S1 field value indicates that the preamble is a T2 preamble and data is transmitted in the format of Single-Input Single-Output (SISO) (T2_SISO), and, when the S1 field value is 001, the S1 field value indicates that the preamble is the T2 preamble and data is transmitted in the format of Multiple-Input Multiple-Output (MIMO) (T2_MIMO). In addition, when the S1 field value is 010, the preamble is a non-T2 preamble. The S2 field signals attribute information about the data. For example, the attribute information about the data may be information about the type, length, interval, etc. of the data and may be signaled by the S2 field.

The P2 symbol is used to transmit the L1 signaling (or L1 signaling information). The L1 signaling may include L1 pre-signaling (or L1 pre-signaling information), and L1 post-signaling (or L1 post-signaling information).

The L1 pre-signaling includes information that is required when a receiving apparatus (not shown) receives the L1 post-signaling and decodes it. The L1 post-signaling includes a parameter that is required when the receiving apparatus accesses the PLP. Specifically, the L1 post-signaling includes configurable L1 post-signaling, dynamic L1 post-signaling information, extension L1 post-signaling information, and CRC information, and may further include L1 padding data.

As described above, since the L1 post-signaling includes the parameter that is required to access the PLP, the L1 post-signaling may have a variable length, that is, may be comprised of a variable number of bits according to the number of PLPs.

Hereinafter, a method for processing L1 post-signaling of L1 signaling of the transmitting apparatus 100 according to an exemplary embodiment will be explained in detail. Hereinafter, lengths of a codeword, an information word, a parity, L1 signaling, and various fields mean the number of bits included therein. For example, the length of a codeword means the number of bits included in the codeword.

The segmenter 110 segments L1 signaling. The L1 signaling recited herein may be L1 post-signaling.

In this case, when the length of the L1 signaling is longer than that encodable by the encoder 120, the segmenter 110 segments the L1 signaling. The length encodable by the encoder 120 corresponds to a length of an information word in Bose Chaudhuri Hocquenghem (BCH) encoding performed by the encoder 120.

However, this is merely an example. When the encoder 120 performs only Low Density Parity Check (LDPC) encoding without performing the BCH encoding, and the length of the L1 signaling is longer than a length of an information word in LDPC encoding, the segmenter 110 segments the L1 signaling.

The segmenter 110 segments the L1 signaling as follows:

Specifically, bits constituting the L1 signaling are transmitted through at least one LDPC block (that is, an LPDC codeword). In this regard, the segmenter 110 determines the number of LDPC blocks ($N_{post\_FEC\_Block}$) using Equation 1:

$$N_{post\_FEC\_Block} = \left\lceil \frac{K_{post\_ex\_pad}}{K_{bch}} \right\rceil \quad (1)$$

where $K_{bch}$ is a length of an information word of BCH encoding, and $K_{post\_ex\_pad}$ is a length of L1_POST_INFO_SIZE to which 32 bits are added. L1_POST_INFO_SIZE indicates lengths of configurable, dynamic, and extension except for CRC and L1 padding parts in the L1 post-signaling. In this regard, $K_{post\_ex\_pad}$ may be calculated by adding 32 bits, which correspond to the length of the CRC, to L1_POST_INFO_SIZE.

In the above example, the L1 post-signaling includes configurable, dynamic, and extension. However, this is merely an example. The signaling included in the L1 post-signaling may be configured in forms other than configurable, dynamic, and extension.

The segmenter 110 calculates the number of padding bits (for example, zero-value bits) to be added (or padded) to the L1 signaling to segment, that is, a length of a L1_PADDING field, $K_{L1\_PADDING}$ using Equation 2:

$$KN_{L1\_PADDING} = \left\lceil \frac{K_{post\_ex\_pad}}{N_{post\_FEC\_Block}} \right\rceil \times N_{post\_FEC\_Block} - K_{post\_ex\_pad} \quad (2)$$

After that, the segmenter 110 adds the padding bit to the L1 signaling and segments the L1 signaling to which the padding bit is added.

Specifically, the segmenter 110 calculates a length of the L1 signaling to which the padding bit is added, $K_{post}$, using Equation 3, and calculates a length of each L1 signaling to be segmented, $K_{sig}$, by dividing $K_{post}$, which is the length of the L1 signaling to which the padding bit is added, by the number of LDPC blocks, $N_{post\_FEC\_Block}$, using Equation 4. The segmenter 110 segments the L1 signaling according to the calculated $K_{sig}$, and generates a plurality of segmented L1 signalings each having the length of $K_{sig}$.

$$K_{post} = K_{post\_ex\_pad} + K_{L1\_PADDING} \quad (3)$$

$$K_{sig} = \frac{K_{post}}{N_{post\_FEC\_Block}} \quad (4)$$

Figure 2:
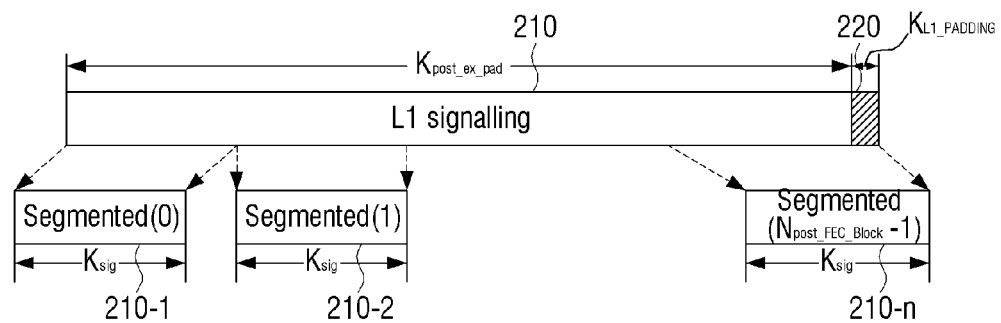
FIG. 2 is a view to illustrate a method for segmenting L1 signaling according to an exemplary embodiment.

FIG. 2 is a view to illustrate a method for segmenting L1 signaling according to an exemplary embodiment.

As shown in FIG. 2, $K_{L1\_PADDING}$ bit 220 may be added to L1 signaling 210 having the length of $K_{post\_ex\_pad}$ and then the L1 signaling 210 may be segmented into $N_{post\_FEC\_Block}$ number of L1 signalings. Accordingly, each of the segmented L1 signalings 210-1, 210-2, ..., 210-n has the length of $K_{sig}$.

In this method, the segmenter 110 segments the L1 signaling, and outputs the segmented L1 signaling to the encoder 120.

The encoder 120 performs BCH encoding and LDPC encoding with respect to each of the segmented L1 signalings 210-1, 210-2, ..., 210-n.

In this case, the encoder 120 adds (or pads) zero-value bits (for example, zero padding bits) to the segmented L1 signaling to have a length that is encodable by the encoder 120, and encodes the L1 signaling to which zero-value bits are added.

That is, when the length of the segmented L1 signaling is shorter than a length of an information word of the BCH encoding, the encoder 120 adds as many zero-value bits to the segmented L1 signaling as a corresponding number and performs BCH encoding.

For example, when the segmented L1 signaling is comprised of $K_{sig}$ number of bits and the number of bits of the information word of the BCH encoding is $K_{bch}$, and $K_{bch} > K_{sig}$, the encoder 120 adds shortened $K_{bch} - K_{sig}$ number of zero-value bits to the segmented L1 signaling and then performs BCH encoding with respect to the L1 signaling to which zero-value bits are added.

However, this is merely an example. When the encoder 120 performs only LDPC encoding without performing BCH encoding, and the length of the segmented L1 signaling is shorter than a length of an information word of the LDPC encoding, the encoder 120 may add as many zero-value bits to the segmented L1 signaling as a corresponding number and may perform LDPC encoding.

The encoder 120 may perform LDPC encoding with respect to the BCH-encoded L1 signaling. That is, the encoder 120 performs LDPC encoding with respect to the L1 signaling to which BCH parity bits are added by BCH encoding, thereby generating an LDPC codeword.

In this case, the L1 signaling to which BCH parity bits are added is an information word of LDPC coding, and the LDPC codeword may be comprised of an information word and LDPC parity bits. The encoder 120 systematically performs LDPC encoding and thus the LDPC codeword generated by LDPC encoding includes the information word as it is.

Figure 3:
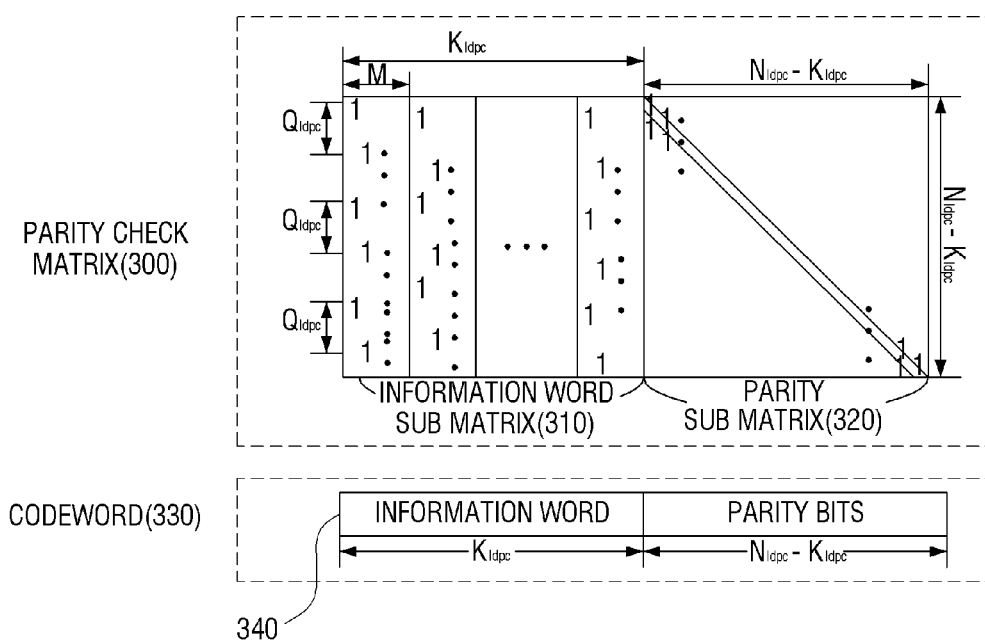
FIGS. 3 and 4 are views to illustrate a configuration of a parity check matrix according to an exemplary embodiment.
Figure 4:
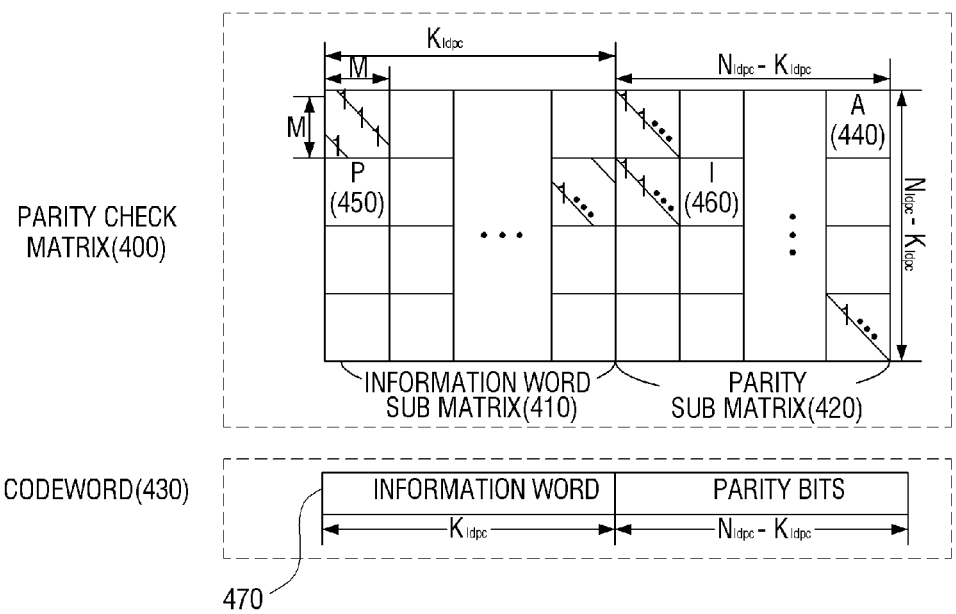

The encoder 120 may perform LDPC encoding using a parity check matrix of a configuration shown in FIG. 3 or 4.

Referring to FIGS. 3 and 4, a parity check matrix 300, 400 includes an information word sub matrix 310, 410 which is a sub matrix corresponding to an information word, and a parity sub matrix 320, 420 which is a sub matrix corresponding to a parity. In the parity check matrix 300, 400, an element of a part except for 1 is 0.

$N_{ldpc}$ is a length of an LDPC codeword and $K_{ldpc}$ is a length of an information word. The length of the codeword 330, 430 corresponds to the number of bits included in the codeword 330, 430. The length of the information word 340, 470 corresponds to the number of bits included in the information word 340, 470. In FIG. 3, M is an interval in which a pattern of a column is repeated in the information word sub matrix 310, and $Q_{ldpc}$ is a size by which each column is shifted in the information word sub matrix 310. Integers M and $Q_{ldpc}$ are determined to satisfy $Q_{ldpc} = (N_{ldpc} - K_{ldpc})/M$. $K_{ldpc}/M$ is also an integer. Detailed values of M and $Q_{ldpc}$ vary according to the length of the codeword and a code rate.

For example, $Q_{ldpc}$ may be defined as in Table 1 ($Q_{ldpc}$ value for normal frames (normal FECFRAME $N_{ldpc}$=64800)), and Table 2 ($Q_{ldpc}$ value for short frames (short FECFRAME $N_{ldpc}$=16200)), and M is variable according to $Q_{ldpc}$. However, this is merely an example and $Q_{ldpc}$ may have various values.

TABLE 1

| Code Rate | $Q_{ldpc}$ |
|---|---|
| 1/2 | 90 |
| 3/5 | 72 |
| 2/3 | 60 |
| 3/4 | 45 |

TABLE 1-continued

| Code Rate | $Q_{ldpc}$ |
|---|---|
| 4/5 | 36 |
| 5/6 | 30 |

TABLE 2

| Code Rate | $Q_{ldpc}$ |
|---|---|
| 1/4 | 36 |
| 1/3 | 30 |
| 2/5 | 27 |
| 1/2 | 25 |
| 3/5 | 18 |
| 2/3 | 15 |
| 3/4 | 12 |
| 4/5 | 10 |
| 5/6 | 8 |

Referring to FIG. 3, the parity check matrix 300 is divided into the information word sub matrix 310 corresponding to the information word, and the parity sub matrix 320 corresponding to the parity. The information word sub matrix 310 includes $K_{ldpc}$ number of columns and the parity sub matrix 320 includes $N_{parity} = N_{ldpc} - K_{ldpc}$ number of columns. The number of rows of the parity check matrix 300 is the same as the number of columns of the parity sub matrix 320, $N_{ldpc} - K_{ldpc}$.

In the parity sub matrix 320 which includes ($K_{ldpc}$)th to ($N_{ldpc}$−1)th columns of the parity check matrix 300, positions of elements having weight-1, that is, 1, have a dual diagonal configuration. Accordingly, the degree of columns except for ($N_{ldpc}$−1)th column from among the columns included in the parity sub matrix 320 is 2 and the degree of ($N_{ldpc}$−1)th column is 1.

The information word sub matrix 310 which includes $0^{th}$ to ($K_{ldpc}$−1)th columns follows the following rules:

Firstly, $K_{ldpc}$ number of columns corresponding to the information word in the parity check matrix 300 are grouped M by M, and thus are grouped into $K_{ldpc}/M$ number of column groups in total. The columns belonging to the same column group are shifted from one another as much as $Q_{ldpc}$.

Secondly, when the degree of $0^{th}$ column of the ith column group (i=0, 1, . . . , $K_{ldpc}/M$) is $D_i$ and a position of each row where 1 exists $R_{i,0}^{(0)}, R_{i,0}^{(1)}, \ldots R_{i,0}^{(D_i-1)}$, an index of the row where weight-1 exists in the jth column of the ith column group, $R_{i,j}^{(k)}$, is determined using Equation 5:

$$R_{i,j}^{(k)} = R_{i,(j-1)}^{k} + Q_{ldpc} \bmod(N_{ldpc} - K_{ldpc}) \quad (5)$$

where k=0, 1, 2, . . . , $D_i$−1, i=0, 1, . . . , $K_{ldpc}/M$−1, and j=0, 1, 2, . . . , M−1.

Equation 5 may be expressed by Equation 6:

$$R_{i,j}^{(k)} = \{R_{i,0}^{(k)} + (j \bmod M) \times Q_{ldpc}\} \bmod(N_{ldpc} - K_{ldpc}) \quad (6)$$

where k=0, 1, 2, . . . , $D_i$−1, i=0, 1, . . . , $K_{ldpc}/M$−1, and j=0, 1, 2, . . . , M−1.

In above Equation 5 or 6, $R_{i,j}^{(k)}$ is an index of the row where kth weight-1 exists in the jth column of the ith column group, $N_{ldpc}$ is a length of an LDPC codeword, $K_{ldpc}$ is a length of an information word, $D_i$ is a degree of columns belonging to the ith column group, and M is the number of columns belonging to one column group.

Also, according to Equation 5 or 6, once $R_{i,0}^{(k)}$ is known, the index of the row where the kth weight-1 exists in the ith column group is known. Therefore, when the index value of the row where the kth weight-1 exists in the $0^{th}$ column in each column group is stored, positions of the column and row where weight-1 exists can be determined in the parity check matrix 300 of FIG. 3.

According to the above-described rules, columns belonging to the ith column group have the same degree, $D_i$. The LDPC encoding which stores information on the parity check matrix 300 according to the above-described rules may be expressed briefly as follows:

For example, when $N_{ldpc}$ is 30, $K_{ldpc}$ is 15, and $Q_{ldpc}$ is 3, position information of the row where weight-1 exists in the $0^{th}$ column of 3 column groups may be expressed by a sequence of numbers as in Equation 7. The sequence of numbers as in Equation 7 may be referred to as 'weight-1 position sequence'.

$$R_{1,0}^{(1)}=1, R_{1,0}^{(2)}=2, R_{1,0}^{(3)}=8, R_{1,0}^{(4)}=10,$$

$$R_{2,0}^{(1)}=0, R_{2,0}^{(2)}=9, R_{2,0}^{(3)}=13,$$

$$R_{3,0}^{(1)}=0, R_{3,0}^{(2)}=14. \qquad (7)$$

where $R_{i,j}^{(k)}$ is an index of the row where kth weight-1 exists in the jth column of the ith column group.

The weight-1 position sequence indicating the index of the row where 1 exists in the $0^{th}$ column of each column group as in Equation 7 may be expressed more briefly as in Table 3:

TABLE 3

| |
|---|
| 1 2 8 10 |
| 0 9 13 |
| 0 14 |

Table 3 shows a position of an element having weight-1, in other words, 1, in the parity check matrix, and the ith weight-1 position sequence is expressed by indexes of the rows where weight-1 exists in the $0^{th}$ column belonging to the ith column group.

When the columns and rows of the parity check matrix 300 shown in FIG. 3 are permuted by Equation 8 (Row permutation) and Equation 9 (Column permutation), the parity check matrix is illustrated in the form of the parity check matrix 400 shown in FIG. 4.

$$Q_{ldpc} \cdot i+j \Rightarrow M \cdot j+i (0 \leq i < M, 0 \leq j < Q_{ldpc}) \qquad (8)$$

$$K_{ldpc}+Q_{ldpc} \cdot k+l \Rightarrow K_{ldpc}+M \cdot l+k (0 \leq k < M, 0 \leq l < Q_{ldpc}) \qquad (9)$$

For example, the row permutation refers to changing the order of the indexes of the row of the parity check matrix 300 using Equation 8. The column permutation refers to changing the order of the indexes of the columns of the parity check matrix 300 using Equation 9.

The method for permuting based on Equations 8 and 9 is as follows. The column permutation applies the same principle as the row permutation except for that the column permutation is applied only to the parity sub matrix 320. Therefore, the row permutation will be explained by way of an example.

In the case of the row permutation, regarding the Xth row, i and j satisfying $X=Q_{ldpc} \times i+j$ are calculated, and, by assigning i and j to $M \times j+i$, a row into which the Xth row is permuted is calculated. For example, when the $7^{th}$ row is to be permuted and $Q_{ldpc}$ is 2, i and j satisfying $7=2 \times i+j$ are 3 and 1, respectively, and thus the $7^{th}$ row is permuted into the $13^{th}$ row since $10 \times 1+3=13$.

The parity check matrix 300 of FIG. 3 is illustrated in the form of the parity check matrix 400 of FIG. 4 by the row permutation of Equation 8 and the column permutation of Equation 9.

Referring to FIG. 4, the whole parity check matrix 400 is divided into a plurality of partial blocks and each partial block corresponds to a quasi-cyclic matrix of an M×M size.

Accordingly, the parity check matrix 400 is configured on a basis of an M×M matrix. That is, the parity check matrix 400 has a M×M partial matrix arranged in the plurality of partial blocks.

M number of columns in the M×M partial matrix may be referred to as a column block, and M number of rows may be referred to as a row block. Accordingly, the parity check matrix 400 having the configuration of FIG. 4 may be comprised of $N_{qc\_column}=N_{ldpc}/M$ number of column blocks and $N_{qc+row}=N_{parity}/M$ number of row blocks.

Hereinafter, the sub matrix having the M×M size will be explained in detail.

Firstly, an M×M matrix 440 of the ($N_{qc\_column}$−1)th column of the $0^{th}$ row has the form of Equation 10:

$$A = \begin{bmatrix} 0 & 0 & \ldots & 0 & 0 \\ 1 & 0 & \ldots & 0 & 0 \\ 0 & 1 & \ldots & 0 & 0 \\ \vdots & \vdots & \vdots & \vdots & \vdots \\ 0 & 0 & \ldots & 1 & 0 \end{bmatrix} \qquad (10)$$

As described above, in the M×M matrix 440 of the ($N_{qc\_column}$−1)th column of the $0^{th}$ row, values of the $0^{th}$ row and (M−1)th column are all '0', in respect of $0 \leq i \leq (M-2)$, the (i+1)th row of the ith column are '1', and the other values are '0'.

Secondly, in the parity sub matrix 420, in respect of $0 \leq i \leq (N_{ldpc}-K_{ldpc})/M-1$, the ith row block of the ($K_{ldpc}/M+$i)th column block is comprised of an identity matrix $I_{M \times M}$ 460. Also, in respect of $0 \leq i \leq (N_{ldpc}-K_{ldpc})/M-2$, the (i+1)th row block of the ($K_{ldpc}/M+$i)th column block is comprised of an identity matrix $I_{M \times M}$ 460.

Thirdly, the information word sub matrix 410 is comprised of a circulant permutation matrix $P^{a_{ij}}$ 450 ('circulant permutation matrix P').

The circulant permutation matrix P 450 is a square matrix having an M×M size, and may have a cyclic-shifted configuration of an identity matrix. Accordingly, the circulant permutation matrix P 450 may be a matrix in which weight of each of the M number of rows is 1 and weight of each of the M number of columns is also 1.

For example, the circulant permutation matrix P which is shifted to the right by 1 unit may be expressed by Equation 11:

$$P = \begin{bmatrix} 0 & 1 & 0 & & 0 \\ 0 & 0 & 1 & \ldots & 0 \\ \vdots & \vdots & \vdots & & \vdots \\ 0 & 0 & 0 & \ldots & 1 \\ 1 & 0 & 0 & & 0 \end{bmatrix} \qquad (11)$$

$P^{a_{ij}}$ is a sub matrix existing at a point where the ith row block of the parity check matrix and the jth column block intersect. Accordingly, i and j indicate the numbers of row blocks and column blocks of the partial blocks corresponding to the information word part. When the superscript $a_{ij}$ of $P^{a_{ij}}$ is 0, $P^0$ indicates the identify matrix $I_{M \times M}$, and, when the superscript $a_{ij}$ of $P^{a_{ij}}$ is ∞, $P^\infty$ indicates a zero matrix.

As described above, the encoder 120 pre-stores the parity check matrix 300, 400 of the configuration of FIG. 3 or 4, and performs LDPC encoding using the parity check matrix. Also, although not shown in FIG. 1, the transmitting apparatus 100 may include a separate memory (not shown) to store the parity check matrix having the configuration of FIG. 3 or 4.

The encoder 120 may puncture parity bits from the LDPC parity bits added by the LDPC encoding. The number of parity bits that are punctured may be as many as a number bits of a predetermined group unit. When the LDPC parity bits are grouped by a predetermined criterion, the predetermined group unit may be an integer multiple of the number of LDPC parity bits included in each group. The predetermined criterion may be determined according to a constant corresponding to an LDPC code rate, for example, may be $Q_{ldpc}$.

That is, when the encoder 120 groups the LDPC parity bits into $Q_{ldpc}$ number of groups, the encoder 120 may puncture as many parity bits from the LDPC parity bits as an integer multiple of the number of parity bits included in each group. In this case, since the relationship of $Q_{ldpc}=(N_{ldpc}-K_{ldpc})/M$ is established, the number of LDPC parity bits included in each group is M. As a result, the number of LDPC parity bits punctured by the encoder 120 may puncture may be as many as an integer multiple of M.

The predetermined group unit may mean an integer multiple of the size of the sub matrix constituting the parity check matrix which is used in the LDPC encoding. That is, referring to FIG. 4, the parity check matrix 400 is comprised of the sub matrix of the M×M size. Therefore, the number of LDPC parity bits punctured by encoder 120 may be as many as an integer multiple of the number of columns or rows of the sub matrix having the M×M size, that is, as many as an integer multiple of M.

In this case, the punctured parity bits are not transmitted to a receiving apparatus (not shown).

The encoder 120 may calculate bits $N_{punc}$ of the predetermined group unit to be punctured using Equation 12:

$$N_{punc} = \left\lfloor \frac{A \times (K_{bch} - K_{sig}) + B}{M} \right\rfloor \times M \qquad (12)$$

where A is a ratio between the number of bits to be shortened and the number of bits to be punctured, B is a correction value, and M is the number of LDPC parity bits included in each group.

In this case, the encoder 120 may determine A and B such that as the number of bits to be shortened increases, that is, as $K_{bch}-K_{sig}$ increases, a ratio of the number of LDPC parity bits to be punctured decreases, and thus target performance of a signal to noise ratio (SNR)-bit error rate (BER) graph can be achieved. Accordingly, the code rate of LDPC encoding after shortening and puncturing decreases as $K_{sig}$ decreases. A detailed description regarding this will be explained with reference to FIG. 5.

Figure 5:
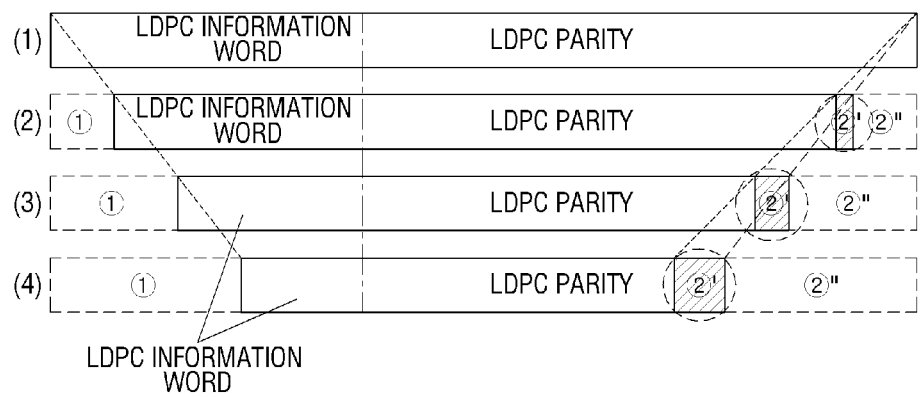
FIGS. 5, 6A and 6B are views to illustrate a method for puncturing according to an exemplary embodiment.

FIG. 5 is a view to illustrate a method for puncturing according to an exemplary embodiment.

Referring to FIG. 5, view (1) of FIG. 5 indicates a case of $K_{bch}=K_{sig}$, and views (2) to (4) of FIG. 5 indicate a case of $K_{bch}>K_{sig}$ in which the number of bits is shortened by as many as ①. When puncturing is performed according to a ratio of shortening, as many as ②'+②" bits should be punctured in each of views (2) to (4) of FIG. 5. However, according to an exemplary embodiment, A and B are determined such that as $K_{sig}$ decreases, the code rate of LDPC encoding after shortening and puncturing decreases, and thus, as many as ②' less bits are punctured. That is, as many as ②" bits are punctured as shown in views (2) to (4) of FIG. 5.

The encoder 120 groups the parity bits. Specifically, the encoder 120 groups $N_{ldpc}-K_{ldpc}$ number of LDPC parity bits $\{p_0, p_1, \ldots, p_{N_{ldpc}-K_{ldpc}-1}\}$ into $Q_{ldpc}$ number of parity groups, as shown in FIG. 6A or 6B.

There are two methods for grouping the parity bits into parity groups.

Figure 6A:
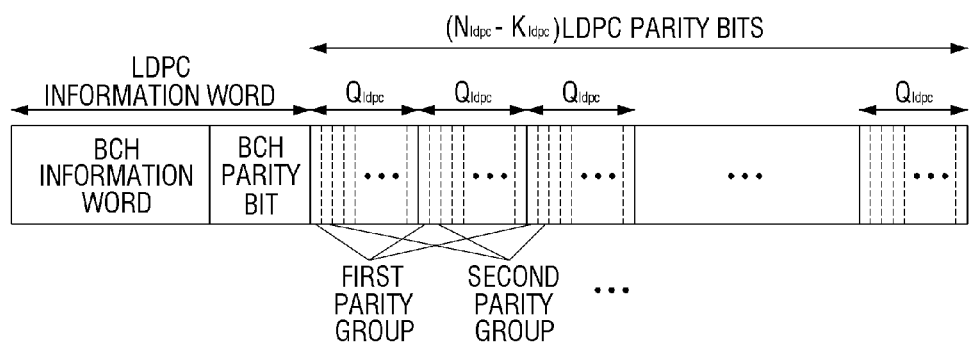
Figure 6B:
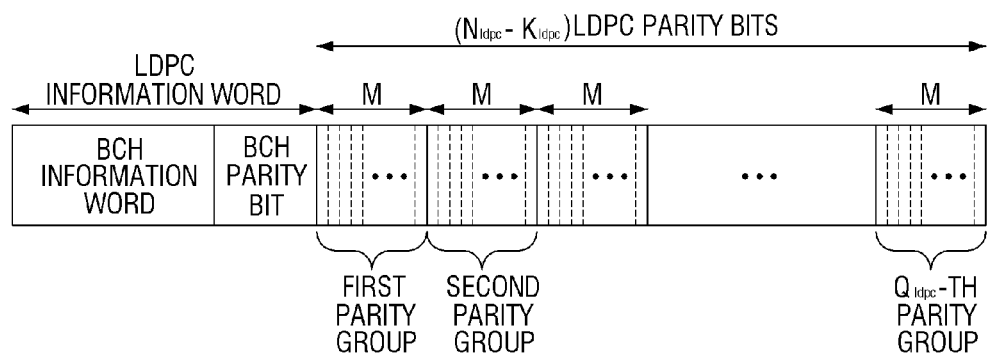

The first method is performing LDPC encoding based on the parity check matrix having the configuration of FIG. 3 without using a parity interleaver 1023 (see FIG. 11) (see FIG. 6A). In this method, each parity group $P_j$ may be expressed by Equation 13, and each parity group $P_j$ forms a sub set of $N_{ldpc}-K_{ldpc}$ number of LDPC parity bits:

$$P_j = (p_k | k \bmod Q_{ldpc} = j, 0 \le k < N_{ldpc} - K_{ldpc}) \qquad (13)$$

where $0 \le j < Q_{ldpc}$ and $P_j$ is the jth parity group.

The second method is performing LDPC encoding based on the parity check matrix having the configuration of FIG. 4 or performing LDPC encoding based on the parity check matrix having the configuration of FIG. 3 and then interleaving the parity constituting the LDPC codeword using the parity interleaver 1023 (see FIG. 6B). In this method, each parity group $P_j$ may be expressed by Equation 14, and each parity group $P_j$ forms a sub set of $N_{ldpc}-K_{ldpc}$ number of LDPC parity bits:

$$P_j \left\{ P_k \left| \left\lfloor \frac{k}{M} \right\rfloor = j, 0 \le k < N_{ldpc} - K_{ldpc} \right. \right\} \qquad (14)$$

where $0 \le j < Q_{ldpc}$ and $P_j$ is the jth parity group.

The encoder 120 may puncture bits of a predetermined group unit using the grouped parity bits. That is, each of the parity groups is comprised of M number of parity bits as shown in FIGS. 6A and 6B. In this respect, the encoder 120 may puncture as many parity groups from the LDPC parity bits as an integer multiple of M, which is calculated using Equation 12. Accordingly, the number of LDPC parity bits after puncturing is a multiple of M.

In this case, the encoder 120 may puncture a certain parity group. That is, the encoder 120 may puncture as many parity groups as an integer multiple of M, which is calculated using Equation 12, regardless of the order of the parity groups. For example, when the number of LDPC parity bits to be punctured is 2×M, the encoder 120 may select certain two parity groups (for example, $P_1$ and $P_3$ or $P_2$ and $P_3$) from among the first parity group, the second parity group, . . . , the $Q_{ldpc}$th parity group, and puncture the parity groups.

As described above, the encoder 120 punctures as many parity bits as an integer multiple of the size of the sub matrix to improve LDPC decoding performance. That is, when a transmitting side punctures as many parity bits as an integer multiple of M, a receiving side reconfigures the parity check matrix by removing as many of the sub matrixes as an integer multiple of M from the parity check matrix shown in FIG. 4, which corresponds to the number of parity bits punctured, and perform LDPC decoding using the reconfigured check matrix. The parity check matrix can be reconfigured as described above because the parity check matrix is comprised of the sub matrix of the M×M size. As a result, the receiving side performs LDPC decoding using the parity sub matrix with the reduced size and thus LDPC decoding performance can be improved.

The encoder 120 removes the added zero-value bits (0 padding bits). That is, the encoder 120 may remove $K_{bch}-K_{sig}$ number of 0 padding bits which have been added to the segmented L1 signaling for encoding.

Figure 7:
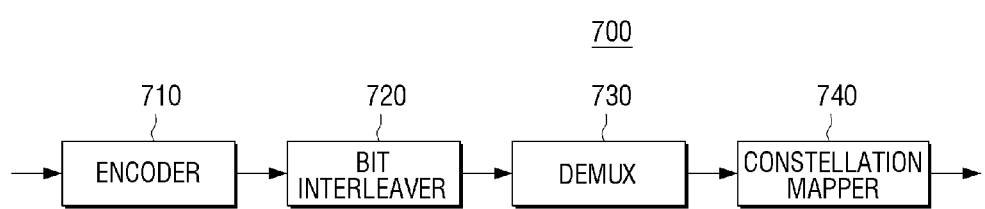
FIG. 7 is a block diagram to illustrate a configuration of a transmitting apparatus according to an exemplary embodiment.

FIG. 7 is a block diagram to illustrate a configuration of a transmitting apparatus according to an exemplary embodiment. Referring to FIG. 7, a transmitting apparatus 700 may include an encoder 710, a bit interleaver 720, a demultiplexer 730, and a constellation mapper 740.

The encoder 710 performs LDPC encoding with respect to L1 signaling, thereby generating an LDPC codeword. In this case, the encoder 710 LDPC-encodes the L1 signaling and generates the LDCP codeword which is comprised of the information word and LDPC parity bits. The L1 signaling recited herein may be L1 post-signaling.

The encoder 710 may perform LDPC encoding based on various code rates.

Figure 11:
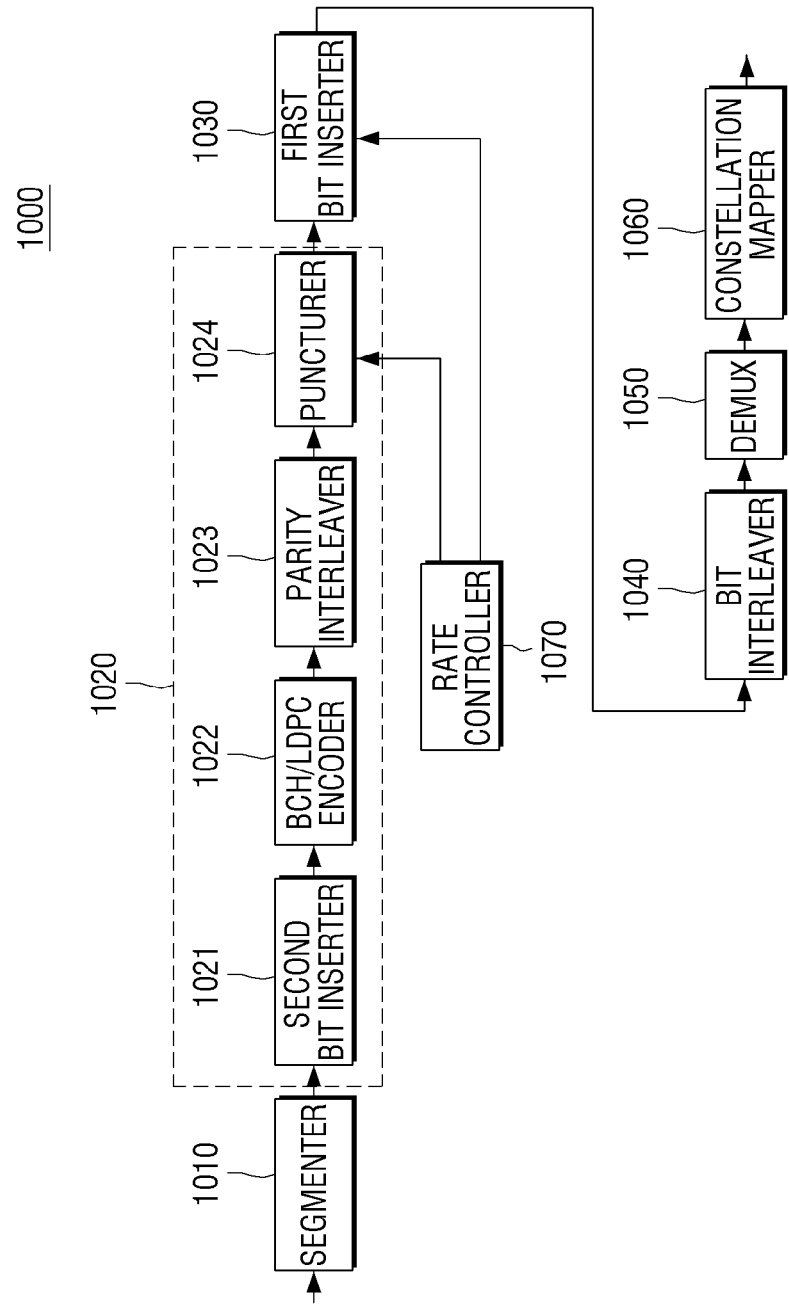
FIG. 11 is a block diagram to illustrate a detailed configuration of a transmitting apparatus according to an exemplary embodiment.

The encoder 710 may perform the same functions as those of the encoder 120 shown in FIG. 1. That is, the encoder 710 may generate a shortened/punctured LDPC codeword (hereinafter, referred to as an LDPC codeword) as described in FIG. 1. In this case, the encoder 710 may include a bit inserter 1021, a BCH/LDPC encoder 1022, a parity interleaver 1023, a puncturer 1024, and a bit inserter 1030, as shown in FIG. 11, and a detailed description thereof will be provided with reference to FIG. 11.

The bit interleaver 720 interleaves the LDPC codeword on a bit basis. In this case, the bit interleaver 720 may use $N_c$ number of columns each having $N_r$ number of rows. The number of columns may vary according to a modulation method. For example, in the case of 16-QAM, 64-QAM, and 256-QAM, the number of columns may be 2, 3, and 4, respectively. In addition, in the case of 16-QAM, 64-QAM, and 256-QAM, the number of columns may be 4, 6, and 8, respectively, and may vary according to a modulation method.

Specifically, the bit interleaver 720 may perform bit interleaving by writing each of the bits constituting the LDPC codeword on each column in a column direction, and reading rows of the plurality of columns on which the bits are written in sequence.

The demultiplexer 730 demultiplexes the bit-interleaved LDPC codeword into a cell word (that is, generates a cell word (or a parallel sequence) by rearranging the order of the bits of the bit-interleaved LDPC codeword), and the constellation mapper 740 maps the cell word onto a constellation point. That is, the constellation mapper 740 may map the cell word onto a constellation.

In this case, the constellation mapper 740 may modulate each cell word $[y_{0,q}, \ldots y_{\eta\ mod-1,q}]$ output from the demultiplexer 730 using various modulation methods such as BPSK, QPSK, 16-QAM, 64-QAM, 256-QAM, etc., and may map the cell word onto the constellation. As recited herein η mod is the number of bits transmitted per modulation symbol, and may be 1, 2, 4, 6, 8 in the case of BPSK, QPSK, 16-QAM, 64-QAM, and 256-QAM. Also, q(=do) is a number of bits constituting each sub stream output from the demultiplexer 730.

Specifically, the constellation mapper 740 may determine a real number component $Re(z_q)$ and an imaginary number component $Im(z_q)$ based on a combination of bits $y_{e,q}$ constituting the cell word using Tables 4 to 11 according to a modulation method, and may map the cell word onto the determined constellation point. 'e' is a number (or an index) of sub streams demultiplexed by the demultiplexer 730.

Table 4 shows constellation mapping regarding a real number component in the BPSK, Table 5 shows constellation mapping regarding a real number component in the QPSK, Table 6 shows constellation mapping regarding a imaginary number component in the QPSK, Table 7 shows constellation mapping regarding a real number component in the 16-QAM, Table 8 shows constellation mapping regarding an imaginary number component in the 16-QAM, Table 9 shows constellation mapping regarding a real number component in the 64-QAM, Table 10 shows constellation mapping regarding an imaginary number component in the 64-QAM, Table 11 shows constellation mapping regarding a real number component in the 256-QAM, and Table 12 shows constellation mapping regarding an imaginary number component in the 256-QAM:

TABLE 4

| | | |
|---|---|---|
| $y_{0,q}$ | 1 | 0 |
| $Re(z_q)$ | −1 | 1 |
| $Im(z_q)$ | 0 | 0 |

TABLE 5

| | | |
|---|---|---|
| $y_{0,q}$ | 1 | 0 |
| $Re(z_q)$ | −1 | 1 |

TABLE 6

| | | |
|---|---|---|
| $y_{1,q}$ | 1 | 0 |
| $Im(z_q)$ | −1 | 1 |

TABLE 7

| | | | | |
|---|---|---|---|---|
| $y_{0,q}$ | 1 | 1 | 0 | 0 |
| $y_{2,q}$ | 0 | 1 | 1 | 0 |
| $Re(z_q)$ | −3 | −1 | 1 | 3 |

TABLE 8

| | | | | |
|---|---|---|---|---|
| $y_{1,q}$ | 1 | 1 | 0 | 0 |
| $y_{3,q}$ | 0 | 1 | 1 | 0 |
| $Im(z_q)$ | −3 | −1 | 1 | 3 |

TABLE 9

| | | | | | | | | |
|---|---|---|---|---|---|---|---|---|
| $y_{0,q}$ | 1 | 1 | 1 | 1 | 0 | 0 | 0 | 0 |
| $y_{2,q}$ | 0 | 0 | 1 | 1 | 1 | 1 | 0 | 0 |
| $y_{4,q}$ | 0 | 1 | 1 | 0 | 0 | 1 | 1 | 0 |
| $Re(z_q)$ | −7 | −5 | −3 | −1 | 1 | 3 | 5 | 7 |

TABLE 10

| | | | | | | | | |
|---|---|---|---|---|---|---|---|---|
| $y_{1,q}$ | 1 | 1 | 1 | 1 | 0 | 0 | 0 | 0 |
| $y_{3,q}$ | 0 | 0 | 1 | 1 | 1 | 1 | 0 | 0 |
| $y_{5,q}$ | 0 | 1 | 1 | 0 | 0 | 1 | 1 | 0 |
| $Im(z_q)$ | −7 | −5 | −3 | −1 | 1 | 3 | 5 | 7 |

TABLE 11

| | | | | | | | | | | | | | | | | |
|---|---|---|---|---|---|---|---|---|---|---|---|---|---|---|---|---|
| $y_{0,q}$ | 1 | 1 | 1 | 1 | 1 | 1 | 1 | 1 | 0 | 0 | 0 | 0 | 0 | 0 | 0 | 0 |
| $y_{2,q}$ | 0 | 0 | 0 | 0 | 1 | 1 | 1 | 1 | 1 | 1 | 1 | 1 | 0 | 0 | 0 | 0 |
| $y_{4,q}$ | 0 | 0 | 1 | 1 | 1 | 1 | 0 | 0 | 0 | 0 | 1 | 1 | 1 | 1 | 0 | 0 |
| $y_{6,q}$ | 0 | 1 | 1 | 0 | 0 | 1 | 1 | 0 | 0 | 1 | 1 | 0 | 0 | 1 | 1 | 0 |
| $Re(z_q)$ | −15 | −13 | −11 | −9 | −7 | −5 | −3 | −1 | 1 | 3 | 5 | 7 | 9 | 11 | 13 | 15 |

TABLE 12

| | | | | | | | | | | | | | | | | |
|---|---|---|---|---|---|---|---|---|---|---|---|---|---|---|---|---|
| $y_{1,q}$ | 1 | 1 | 1 | 1 | 1 | 1 | 1 | 1 | 0 | 0 | 0 | 0 | 0 | 0 | 0 | 0 |
| $y_{3,q}$ | 0 | 0 | 0 | 0 | 1 | 1 | 1 | 1 | 1 | 1 | 1 | 1 | 0 | 0 | 0 | 0 |
| $y_{5,q}$ | 0 | 0 | 1 | 1 | 1 | 1 | 0 | 0 | 0 | 0 | 1 | 1 | 1 | 1 | 0 | 0 |
| $y_{7,q}$ | 0 | 1 | 1 | 0 | 0 | 1 | 1 | 0 | 0 | 1 | 1 | 0 | 0 | 1 | 1 | 0 |
| $Im(z_q)$ | −15 | −13 | −11 | −9 | −7 | −5 | −3 | −1 | 1 | 3 | 5 | 7 | 9 | 11 | 13 | 15 |

The constellation point onto which the cell word is mapped may be represented by a corresponding modulation symbol. The modulation symbol recited herein may be comprised of the plurality of bits included in the cell word.

For example, it is assumed that a cell word (0,0,1,0,0,0) is output from the demultiplexer 730 according to the 64-QAM modulation method. In this case, the constellation mapper 740 may determine a real number component $Re(z_q)=1$ and an imaginary number component $Im(z_q)=7$ of the constellation point onto which the cell word (0, 0, 1, 0, 0, 0)=$(y_{0,q}, y_{1,q}, y_{2,q}, y_{3,q}, y_{4,q}, y_{5,q})$ is mapped using Tables 9 and 10, and may map the cell word (0, 0, 1, 0, 0, 0) onto the corresponding constellation point. In this case, a modulation symbol corresponding to the constellation point on which the cell word (0, 0, 1, 0, 0, 0) is mapped may be 001000.

Also, the modulation method may be non-uniform 16-QAM, 64-QAM, and 256-QAM methods other than uniform 16-QAM, 64-QAM, and 256-QAM methods.

Hereinafter, the method for demultiplexing the bit-interleaved LDPC codeword into the cell word by the demultiplexer 730 will be explained in detail with reference to FIGS. 8 to 10.

Figure 8:
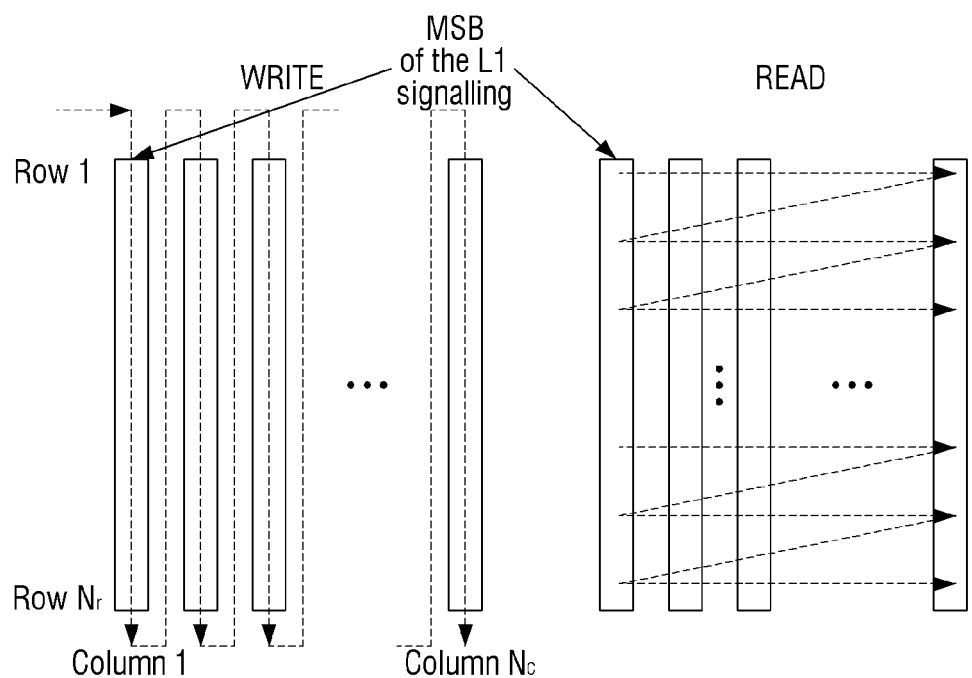
FIGS. 8 to 10C are views to illustrate a method for demultiplexing a bit-interleaved LDPC code word into a cell word according to an exemplary embodiment.

FIG. 8 is a view to illustrate an operation of the bit-interleaver according to an exemplary embodiment. Referring to FIG. 8, the bit interleaver 720 includes $N_c$ number of columns each of which is comprised of $N_r$ number of rows. In this case, the number of columns of the bit interleaver 720 may be the same as ½ of the constellation order.

The bit interleaver 720 writes bits constituting the LDPC codeword on each column in a column direction as shown in FIG. 8. Specifically, the bit interleaver 720 may write the bits constituting the LDPC codeword from the first column to the $N_c$th column in sequence in the column direction. At this time, the bit interleaver 720 writes a most significant bit (MSB) of the LDPC codeword on the first row of the first column and writes the next bits in sequence in the column direction.

The bit interleaver 720 reads the written bits in a row direction as shown in FIG. 8. Specifically, when the bits are written on all of the columns, the bit interleaver 720 may read the bits from the bits written on the first rows of the plurality of columns to the bits written on the $N_r$th rows in sequence in the row direction.

Accordingly, when the LDPC codeword $c=[c_0, c_1, \ldots, c_{N_{POST}-1}]$ is bit-interleaved, the bit-interleaved LDPC codeword $[C_0, C_{Nr}, C_{2Nr}, \ldots, C_{(Nc-1)Nr}, C_1, C_{Nr+1}, C_{2Nr+1}, \ldots ]=[v_0, v_1, v_2, \ldots,]=V$ may be output. $N_{post}$ is the number of LDPC codeword bits into which a certain number of shortened/punctured bits are inserted, and will be explained in detail.

Figure 9:
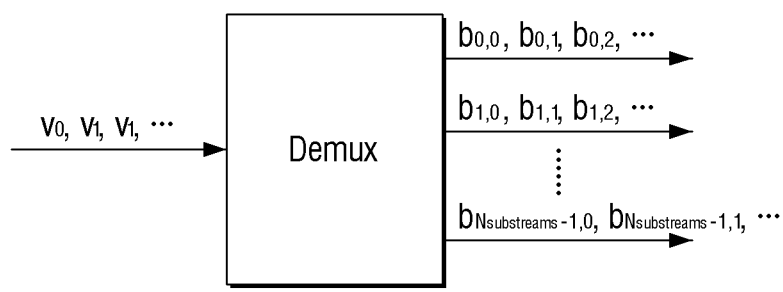

FIG. 9 is a view to illustrate an operation of the demultiplexer 730 according to an exemplary embodiment.

In FIG. 9, respective parameters are defined as follows:

$do = di$ div $N_{substreams}$ (where $N_{substreams}$ is the number of sub streams and may be 1, 2, 4, 6, 8 in the case of BPSK, QPSK, 16-QAM, 64-QAM, 356-QAM, respectively.)

e: number (index) of sub streams to be demultiplexed ($0 \leq e < N_{substreams}$)

$v_{di}$: input of demultiplexer 730 di: number (or index) of input bits $b_{e,do}$: output of demultiplexer 730 do: bit number (or index) constituting each sub stream output from demultiplexer 730

The demultiplexer 730 may receive the bit-interleaved LDPC codeword $V=[v_0, v_1, v_2, \ldots,]$, and may output the input bits to one of a plurality of sub streams in sequence. Specifically, the de-multiplexer 730 outputs $N_{substreams}$ number of bits from among the input bits to the first to Nth sub streams, and outputs the next $N_{substreams}$ number of bits to the first to Nth sub streams, following the $N_{substreams}$ number of bits output to the first to Nth sub streams.

A cell word is comprised of bits having the same bit number in each sub stream like $[y_{0,do} \cdots y_{n_{\text{mod}}-1,do}] = [b_{0,do} \cdots b_{N_{substreams}-1,do}]$. In this respect, the bit-interleaved LDPC codeword may be demultiplexed into the cell word.

In this case, the demultiplexer 730 may demultiplex the bit-interleaved LDPC codeword into the cell word considering characteristics of the LDPC encoding and the modulation symbol corresponding to the constellation point. That is, the demultiplexer 730 may determine a location of a sub stream to demultiplex input bits considering characteristics of the LDPC encoding and the modulation symbol, and may demultiplex the input bits to the determined location and demultiplex the bit-interleaved LDPC codeword into the cell word.

In general, a specific method for mapping an LDPC codeword onto bits constituting a modulation symbol may vary according to a code rate and a ratio of bits decoded relatively well from among bits constituting the LDPC codeword.

In an exemplary embodiment, since the LDPC codeword is shortened and punctured and the code rate is variable according to the input bits, the demultiplexer 730 may demultiplex the bit-interleaved LDPC codeword into the cell word, so that a bit that shows relatively good error correcting performance according to LDPC encoding characteristics from among the bits constituting the bit-interleaved LDPC codeword, can be mapped onto a bit of a modulation symbol equally according to a detecting ability of the bit of the modulation symbol.

The bit that shows relatively good error correcting performance is a bit that is relatively located at a front end from among the plurality of bits of the LDPC codeword, and thus may be a bit that is written on the column relatively located at a front end from among the plurality of columns of the bit interleaver 720.

That is, according to the characteristics of the LDPC encoding, the bits constituting the LDPC codeword may be divided into a bit that has a relatively good error correcting ability, and a bit that does not. The bits that have the relatively good error correcting ability are generally located at the front end of the LDPC codeword. Accordingly, the bits may have the relatively good error correcting ability as they go toward the MSB of the LDPC codeword.

The bit interleaver 720 performs bit interleaving by writing the MSB of the LDPC codeword on the first row of the first column and writing the next bits on each column in sequence in the column direction. Accordingly, the bits that have the relatively good error correcting ability, that is, the bits existing near the MSB of the LDPC codeword, are written on the first column. Therefore, the demultiplexer 730 may determine the bits output from the first column of the bit interleaver 720 as the bits that have the relatively good error correcting ability.

Figure 10A:
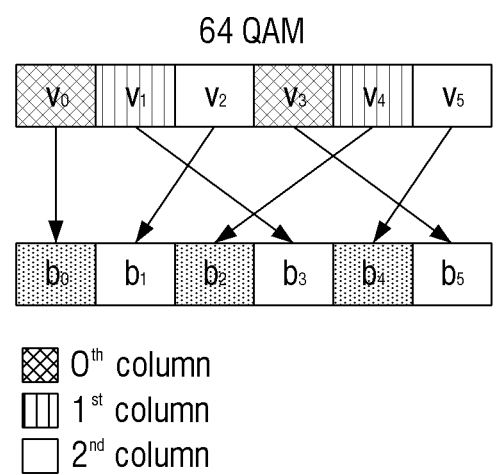

For example, when the 64-QAM modulation method is adopted, the number of columns is 3. Therefore, the demultiplexer 730 may determine bits $v_0$ and $v_3$ which are output from the first column ($0^{th}$ column in FIG. 10A) from among the 3 columns as having the relatively good error correcting ability as shown in FIG. 10A.

Figure 10B:
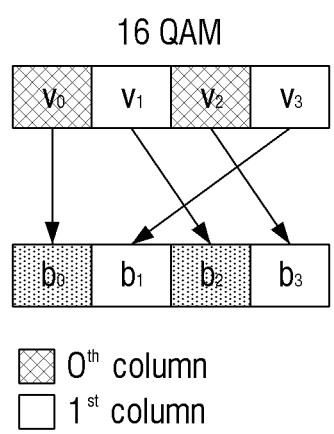
Figure 10C:
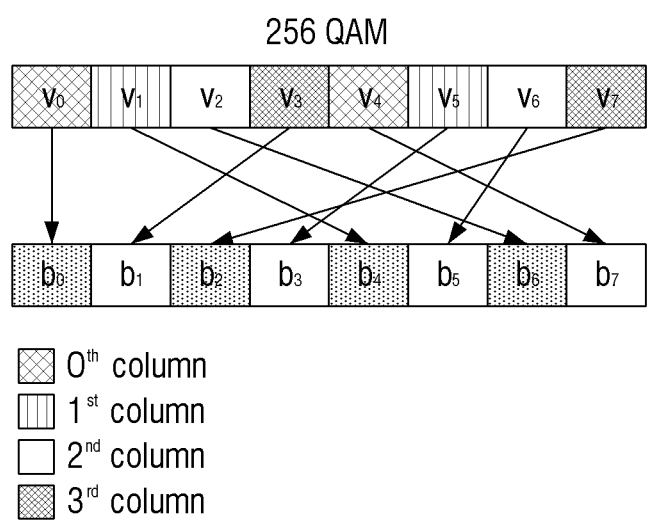

Likewise, when the 16-QAM modulation method is adopted, the number of columns is 2. Therefore, the demultiplexer 730 may determine bits $v_0$ and $v_2$ which are output from the first column ($0^{th}$ column in FIG. 10B) of the two columns as having the relatively good error correcting ability, as shown in FIG. 10B. Also, when the 256-QAM modulation method is adopted, the number of columns is 4. Therefore, the demultiplexer 730 may determine bits $v_0$ and $v_4$ which are output from the first column ($0^{th}$ column in FIG. 10C) from among the four columns as having the relatively good error correcting ability, as shown in FIG. 10C.

The bits constituting the modulation symbol may be divided into a bit that has a relatively good detecting ability and a bit that does not, and, in general, the bit that has the relatively good detecting ability may be a bit that determines signs of the real number component and the imaginary number component of the constellation point.

For example, referring to Tables 9 and 10, in the case of the 64-QAM modulation method, $y_{0,q}$ is a bit that determines a sign of the real number component from among the bits constituting the modulation symbol, and $y_{1,q}$ is a bit that determines a sign of the imaginary number component. These bits may be bits that are output to the first sub streams ($b_{0,0}$, $b_{0,1}$, $b_{0,2}$ . . . ) and the second sub streams $b_{1,0}$, $b_{1,1}$, $b_{1,2}$ . . . ) from among the bits constituting the cell word.

As described above, the demultiplexer 730 may demultiplex the bit-interleaved LDPC codeword into the cell word, so that the bit that has the relatively good error correcting ability according to LDPC encoding characteristics from among the bits constituting the bit-interleaved LDPC codeword, can be mapped onto the bit of the modulation symbol equally according to the detecting performance of the bit of the modulation symbol.

For example, in the case of the 64-QAM modulation method, the demultiplexer 730 may demultiplex so that one of the bits $v_0$ and $v_3$ output from the first column and having the relatively good error correcting ability can be output to one of the first sub stream and the second sub stream constituting the bit that has the relatively good detecting ability from among the bits of the cell word. The demultiplexer 730 may demultiplex so that the other one of the bits output from the first column can be output to a sub stream other than the first sub stream and the second sub stream.

That is, as shown in FIG. 10A, the demultiplexer 730 demultiplexes the bit $v_0$ output from the first column into the first sub stream outputting $b_0$, and demultiplexes the bit $v_3$ output from another first column into a sub stream other than the sub streams outputting $b_0$ and $b_1$, for example, a sub stream outputting $b_5$.

Similarly, in the case of the 16-QAM and 256-QAM modulation methods, the demultiplexer 730 demultiplexes so that one of the bits output from the first column is output to the sub stream constituting the bit that has the relatively good detecting ability from among the bits constituting the cell word, as shown in FIGS. 10B and 10C.

As described, the demultiplexer 730 may demultiplex the bit-interleaved LDPC codeword into the cell word, so that the bit that has the relatively good error correcting ability can be equally mapped onto the bit that determines signs of the real number part and the imaginary number part of the constellation point onto which the modulation symbol is mapped, from among the bits constituting the modulation symbol.

Table 13 presented below shows an example of the above-described demultiplexing method. The demultiplexer 730 may determine a position on the cell word in which each of the bits constituting the bit-interleaved LDPC codeword is demultiplexed according to a modulation method using Table 13.

An input bit number is an index of each of the bits constituting the bit-interleaved LDPC codeword, and an output bit number is an index of each of the bits constituting the cell word.

TABLE 13

| Modulation format | QPSK | | | | | | |
|---|---|---|---|---|---|---|---|
| input bit-number di mod N | 0 | 1 | | | | | |
| Output bit-number, e | 0 | 1 | | | | | |
| Modulation format | 16-QAM | | | | | | |
| Input bit-number, di mod N | 0 | 1 | 2 | 3 | | | |
| Output bit-number, e | 0 | 2 | 3 | 1 | | | |
| Modulation format | 64-QAM | | | | | | |
| Input bit-number, di mod N | 0 | 1 | 2 | 3 | 4 | 5 | |
| Output bit-number, e | 0 | 3 | 1 | 5 | 2 | 4 | |
| Modulation format | 256-QAM | | | | | | |
| Input bit-number, di mod N | 0 | 1 | 2 | 3 | 4 | 5 | 6 | 7 |
| Output bit-number, e | 0 | 4 | 6 | 1 | 7 | 3 | 5 | 2 |

Table 13 illustrates a method for the demultiplexer 730 to determine a position on the cell word in which each of the bits constituting the LDPC codeword is demultiplexed when the encoder 710 performs LDPC encoding.

Referring to Table 13, the demultiplexer 730 demultiplexes the input bit into the sub stream based on a value of a result of performing a modulo operation (di mod $N_{substreams}$) with respect to the input bit number.

For example, in the case of the 64-QAM modulation method, the demultiplexer 730 performs a modulo operation with respect to the first 6 input bits. Accordingly, the demultiplexer 730 demultiplexes the input bit $v_0$ in which a result of the modulo operation is 0 into the first bit $b_{0,0}$ of the first sub stream in which the output bit number e is 0. Likewise, the demultiplexer 730 demultiplexes the input bits $v_1, v_2, v_3, v_4, v_5$ in which results of the modulo operation are 1, 2, 3, 4, 5 into the first bits $b_{3,0}, b_{1,0}, b_{5,0}, b_{2,0}, b_{4,0}$ of the sub streams in which the output bit numbers e are 3, 1, 5, 2, 4.

In the above example, the demultiplexer 730 perform demultiplexing on a basis of 6 bits because the number of bits transmitted per modulation symbol is 6 in the 64-QAM modulation method.

The demultiplexer 730 performs the modulo operation with respect to the next 6 input bits. Accordingly, the demultiplexer 730 demultiplexes the input bit $v_6$ in which a result of the modulo operation is 0 into the second bit $b_{0,1}$ of the first sub stream in which the output bit number e is 0. Likewise, the demultiplexer 730 demultiplexes the input bits $v_1, v_2, v_3, v_4, v_5$ in which results of the modulo operation are 1, 2, 3, 4, 5 into the second bits $b_{3,1}, b_{1,1}, b_{5,1}, b_{2,1}, b_{4,1}$ of the sub streams in which the output bit numbers e are 3, 1, 5, 2, 4.

In this way, the demultiplexer 730 demultiplexes the input bits into the sub streams by applying the modulo operation to every unit of 6 bits.

According to the exemplary embodiment as described above, since the bits that have the relatively good error correcting ability can be equally mapped onto the modulation symbol according to the detecting performance of the bits constituting the modulation symbol, harmony between the detecting performance and the error correcting performance can be achieved.

FIG. 11 is a block diagram to illustrate a detailed configuration of a transmitting apparatus according to an exemplary embodiment. As shown in FIG. 11, a transmitting apparatus 1000 includes a segmenter 1010, an encoder 1020, a first bit inserter 1030, a bit interleaver 1040, a demultiplexer 1050, a constellation mapper 1060, and a rate controller 1070.

The segmenter 1010 and the encoder 1020 may perform the same functions as those of the segmenter 110 and the encoder 120 shown in FIG. 1. Although the first bit inserter 1030 is illustrated as a separate element in FIG. 11, the first bit inserter 1030 may be included in the encoder 1020.

Also, the encoder 1020, the bit interleaver 1040, the demultiplexer 1050, and the constellation mapper 1060 may perform the same functions as those of the encoder 710, the bit interleaver 720, the demultiplexer 730, and the constellation mapper 740 shown in FIG. 7. In this case, the encoder 710 of FIG. 7 may perform the same function as that of the encoder 120 of FIG. 1.

Since the above-described elements have been described with reference to FIGS. 1 to 10, a redundant explanation will be omitted.

The segmenter 1010 segments L1 signaling. The L1 signaling may be L1 post-signaling.

The encoder 1020 encodes the segmented L1 signaling and may include a second bit inserter 1021, a BCH/LDPC encoder 1022, a parity interleaver 1023, and a puncturer 1024.

The second bit inserter 1021 adds 0 padding bits to the segmented L1 signaling and outputs the L1 signaling to which the 0 padding bits are added to the BCH/LDPC encoder 1022.

The BCH/LDPC encoder 1022 performs BCH encoding and LDPC encoding with respect to the L1 signaling received from the second bit inserter 1021. The BCH/LDPC encoder 1022 outputs the encoded L1 signaling to the parity interleaver 1023.

The parity interleaver 1023 interleaves the L1 signaling received from the BCH/LDPC encoder 1022. The parity interleaver 1023 outputs the parity-interleaved L1 signaling to the puncturer 1024.

Specifically, when output of the BCH/LDPC encoder 1022 is λ, the parity interleaver 1023 interleaves only the parity bit of the encoded L1 signaling using Equation 15:

$u_i = \lambda_i$ for $0 \le i < K_{ldpc}$ (information bits are not interleaved)

$u_{K_{ldpc}+360i+s} = \lambda_{K_{ldpc}+Q_{ldpc}s+t}$ for $0 \le s < 360, 0 \le t < Q_{ldpc}$     15, where u indicates a result of parity interleaving, $0 \le i < K_{ldpc}$, $0 \le s < 360$, and $0 \le k < Q_{ldpc}$.

After performing parity interleaving using Equation 15, the parity interleaver 1023 may additionally perform column twist interleaving with respect to the parity-interleaved LDPC codeword.

However, the above-described parity interleaver 1023 may be omitted. That is, the encoded L1 signaling may be directly output to the puncturer 1024 without being parity-interleaved.

The puncturer 1024 performs puncturing with respect to the L1 signaling received from the parity interleaver 1023. Specifically, the puncturer 1024 may puncture as many parity bits from the LDPC parity bits of the L1 signaling as bits of a predetermined group unit. When the LDPC parity bits are grouped by a predetermined criterion, the predetermined group unit may be an integer multiple of the number of LDPC parity bits included in each group.

Also, the puncturer 1024 may remove the 0 padding bits. That is, the puncturer 1024 may remove $K_{bch} - K_{sig}$ number of 0 padding bits which are added by the second bit inserter 1021.

The puncturer 1024 outputs the L1 signaling from which the LDPC parity bits are punctured and the 0 padding bits are removed to the first bit inserter 1030.

The first bit inserter 1030 adds zero-value bits to the encoded L1 signaling. Specifically, the first bit inserter 1030 adds the zero-value bits so that a length of the encoded L1 signaling is an integer multiple of the number of columns constituting the bit interleaver 1040, and outputs the L1 signaling to which the zero-value bits are added to the bit interleaver 1040.

In this case, the first bit inserter 1030 may calculate the number of zero-value bits ($N_{PAD}$) to be added using Equation 16:

$$N_{PAD} = \left\lceil \frac{K_{sig} + P_{bch} + P_{ldpc} - N_{punc}}{N_c} \right\rceil \times N_c - (K_{sig} + P_{bch} + P_{ldpc} - N_{punc}) \quad (16)$$

where $N_c$ is the number of columns of the bit interleaver 1040, $K_{sig}$ is a length of an information word in BCH encoding, $P_{bch}$ is the number of BCH parity bits added by BCH encoding, $P_{ldpc}$ is the number of LDPC parity bits added by LDPC encoding, and $N_{punc}$ is the number of punctured LDPC parity bits.

Figure 12:
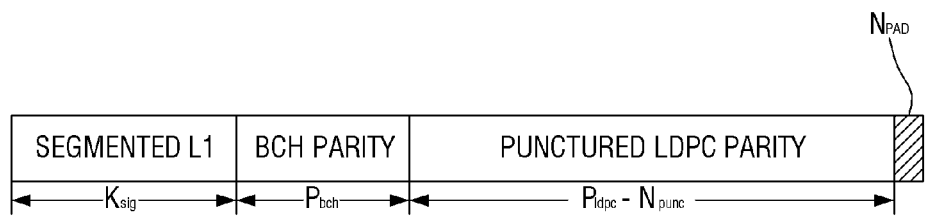
FIG. 12 is a view illustrating L1 signaling to which zero-value bits are added.

FIG. 12 illustrates L1 signaling to which zero-value bits are added according to an exemplary embodiment. As shown in FIG. 12, the number of bits constituting the L1 signaling to which $N_{PAD}$ number of zero-value bits are added, that is, $K_{sig}+P_{bch}+P_{ldpc}-N_{punc}$, may be an integer multiple of the number of columns of the bit interleaver 1040.

The bit interleaver 1040 bit-interleaves the L1 signaling to which the zero-value bits are added. Also, the bit interleaver 1040 outputs the bit-interleaved L1 signaling to the demultiplexer 1050.

In this case, the bit interleaver 1040 is comprised of $N_c$ number of columns each having $N_r$ number of rows, and may perform bit-interleaving using this configuration.

Specifically, the bit interleaver 1040 may perform bit-interleaving by writing bits configured as shown in FIG. 12 on each column in a column direction, and reading rows of the plurality of columns on which the bits are written.

In this case, the bit interleaver 1040 has a configuration as shown in Table 14:

TABLE 14

| Modulation Mode | Rows $N_r$ | Columns $N_c$ |
|---|---|---|
| 16-QAM | $N_{post}/2$ | 2 |
| 64-QAM | $N_{post}/3$ | 3 |
| 256-QAM | $N_{post}/4$ | 4 | where $N_{post}$ is a length of L1 signaling to which zero-value bits are added, that is, $N_{post}=K_{sig}+P_{bch}-N_{punc}+N_{PAD}$.

The demultiplexer 1050 demultiplexes the bit-interleaved L1 signaling into a cell word. Specifically, the demultiplexer 1050 performs demultiplexing by outputting inputs bits as bits of each of the plurality of sub streams using Table 13. The cell word recited herein may be comprised of bits having the same bit number in each sub stream like $[y_{0,do} \cdots y_{\eta\ mod-1,do}]=[b_{0,do} \cdots b_{Nsubstreams-1,do}]$.

The number of cell words and the number of sub streams which are output from the demultiplexer 1050 are as in Table 15 according to a modulation method:

TABLE 15

| Modulation | $\eta$mod | Number of output data cells per codeword | Number of sub streams $N_{substreams}$ |
|---|---|---|---|
| BPSK | 1 | $N_{post}$ | 1 |
| QPSK | 2 | $N_{post}/2$ | 2 |
| 16-QAM | 4 | $N_{post}/4$ | 4 |
| 64-QAM | 6 | $N_{post}/6$ | 6 |
| 256-QAM | 8 | $N_{post}/8$ | 8 |

The constellation mapper 1060 maps the cell word onto a constellation. Specifically, the constellation mapper 1060 may map the cell word output from the demultiplexer 1050 onto the constellation using Tables 4 to 12.

The rate controller 1070 may control each element of the transmitting apparatus 1000. For example, the rate controller 1070 may calculate the number of bits to be punctured and transmit the number to the puncturer 1024, and may calculate the number of bits to be inserted by the first bit inserter 1030 and may transmit the number to the first bit inserter 1030.

Although not shown, the transmitting apparatus 100, 700, 1000 described in FIGS. 1, 7 and 11 may further include an element to transmit the L1 signaling processed in the above-described method to a receiver (not shown). In this case, since the L1 signaling is L1 post-signaling, the transmitting apparatus 100, 700, 1000 may process a data symbol, a P1 symbol, a P2 symbol (Specifically, L1 pre-signaling) as well as the L1 post-signaling, and may transmit the same to a receiving apparatus (not shown). To achieve this, the transmitting apparatus 100, 700, 1000 may further include a module (not shown) to map the data symbol and the preamble symbol onto an OFDM frame and transmit the same to the receiving apparatus (not shown).

Figure 13:
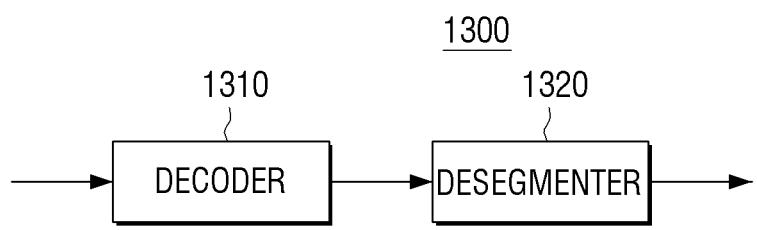
FIG. 13 is a block diagram to illustrate a configuration of a receiving apparatus according to an exemplary embodiment.

FIG. 13 is a block diagram to illustrate a configuration of a receiving apparatus according to an exemplary embodiment. As shown in FIG. 13, a receiving apparatus 1300 includes a decoder 1310 and a desegmenter 1320.

The decoder 1310 may perform decoding using a value corresponding to an LDPC codeword. The value corresponding to the LDPC codeword may be a Log Likelihood Ratio (LLR) value.

Specifically, the decoder 1310 may perform an operation corresponding to the encoder 120 of the transmitting apparatus 100.

That is, the decoder 1310 may insert corresponding values to bits that are punctured in the transmitting apparatus 100 on a basis of a predetermined group unit. In other words, the decoder 1310 may insert corresponding LLR values to the bits punctured by the encoder 120. In this case, the LLR values corresponding to the punctured bits may be '0'.

When LDPC parity bits are grouped by a predetermined criterion, the predetermined group unit may be an integer multiple of the number of LDPC parity bits included in each group. The predetermined criterion may be determined according to a constant corresponding to an LDPC code rate. For example, the predetermined criterion may be $Q_{ldpc}$. A detailed description regarding this has been provided in relation to the transmitting apparatus 100.

In addition, the decoder 1310 may insert corresponding values to the bits that are inserted in the transmitting apparatus 100. That is, the decoder 1310 may insert corresponding LLR values to the '0' bits which are inserted by the encoder 120. In this case, the LLR values corresponding to the '0' bits may be '+∞' or '−∞'.

In addition, the decoder 1310 may perform LDPC decoding and BCH decoding using the LLR values. Accordingly, the decoded data may be segmented L1 signaling. The L1 signaling may be L1 post-signaling.

The desegmenter 1320 may desegment the segmented L1 signaling which is generated by decoding.

Specifically, the desegmenter 1320 performs an operation corresponding to the segmenter 110 of the transmitting apparatus 100. That is, the desegmenter 1320 may generate L1 signaling by removing the padding bits which are added to the segmented L1 signaling and desegmenting the segmented L1 signaling.

Figure 14:
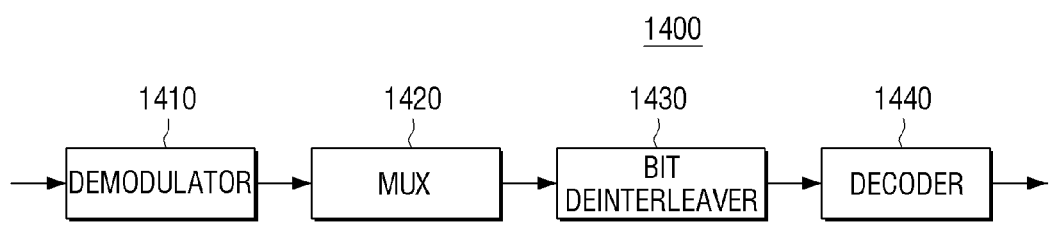
FIG. 14 is a block diagram to illustrate a configuration of a receiving apparatus according to an exemplary embodiment.

FIG. 14 is a block diagram to illustrate a configuration of a receiving apparatus according to an exemplary embodiment. Referring to FIG. 14, a receiving apparatus 1400 includes a demodulator 1410, a multiplexer 1420, a bit deinterleaver 1430, and a decoder 1440.

The demodulator (or constellation demapper) 1410 demodulates a signal which is transmitted from the transmitting apparatus 700. Specifically, the demodulator 1410 demodulates the received signal and generates a value corresponding to an LDPC codeword.

The value corresponding to the LDPC codeword is a value that corresponds to bits mapped onto the constellation points and may be expressed by a channel value for the received signal. There are various methods for determining the channel value and, the method may be a method for determining an LLR value, for example.

Specifically, the LLR value may be a log value of a ratio of the probability that the bit transmitted from the transmitting apparatus 700 is 0 and the probability that the bit is 1. The LLR value may be a bit value itself that is determined according to hard decision, and also, may be a representative value that is determined according to a section having the probability that the bit transmitted from the transmitting apparatus 700 is 0 or 1.

The multiplexer 1420 multiplexes the value corresponding to the LDPC codeword. The value corresponding to the LDPC codeword may be the LLR value for the bits mapped onto the constellation points.

Specifically, the multiplexer 1420 may perform an operation corresponding to the demultiplexer 730 of FIG. 7. That is, the multiplexer 1420 outputs the LLR values corresponding to the bits mapped onto the constellation points in reverse order of the demultiplexer 730. In this case, the multiplexer 1420 performs a reverse operation of the demultiplexer 730 with reference to Table 13 and rearranges the order of the LLR values corresponding to the bits mapped onto the constellation points. That is, the multiplexer 1420 rearranges the order of the LLR values, considering that the transmitting apparatus 700 performs demultiplexing so that the bit that has the relatively good error correcting ability can be equally mapped onto the bit of the modulation symbol according to the detecting performance of the bit of the modulation symbol.

The bit deinterleaver 1430 deinterleaves the value corresponding to the multiplexed LDPC codeword. That is, the bit deinterleaver 1430 may deinterleave the LLR values which are rearranged in order by the multiplexer 1420 on a bit basis.

Specifically, the bit deinterleaver 1430 performs an operation corresponding to the bit interleaver 720 of FIG. 7 That is, the bit deinterleaver 1430 may perform deinterleaving with respect to the LLR values rearranged in order by the multiplexer 1420, by writing in order of rows and outputting in order of columns.

The decoder 1440 performs decoding using a value corresponding to the deinterleaved LDPC codeword. That is, the decoder 1440 performs decoding using the LLR values corresponding to the deinterleaved LDPC codeword.

Specifically, the decoder 1440 may perform an operation corresponding to the encoder 710 of FIG. 7. That is, the decoder 1440 may perform LDPC decoding and BCH decoding using the LLR values.

Since the encoder 710 of FIG. 7 may perform the same function as that of the encoder 120 of FIG. 1, the decoder 1440 may perform the same function as that of the decoder 1310 of FIG. 13.

That is, the decoder 1440 may insert LLR values corresponding to the bits that are removed by puncturing and LLR values corresponding to the inserted '0' bits, and then may perform decoding using these values.

Figure 16:
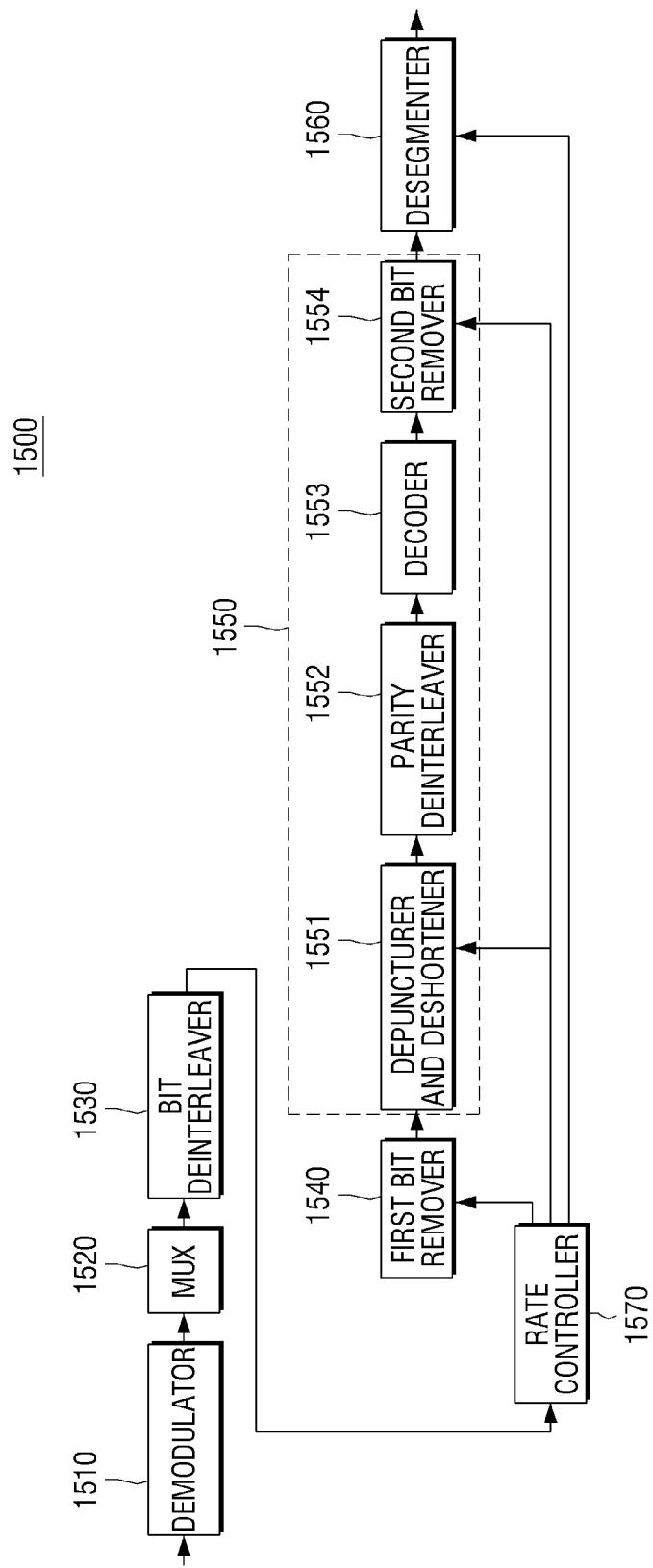
FIG. 16 is a block diagram to illustrate a detailed configuration of a receiving apparatus according to an exemplary embodiment.

FIG. 16 is a block diagram to illustrate a detailed configuration of a receiving apparatus according to an exemplary embodiment. Referring to FIG. 16, a receiving apparatus 1500 includes a demodulator 1510, a multiplexer 1520, a bit de interleaver 1530, a first bit remover 1540, a decoder 1550, a desegmenter 1560, and a rate controller 1570.

The demodulator 1510, the multiplexer 1520, the bit de interleaver 1530, and the decoder 1550 may perform the same functions as those of the demodulator 1410, the multiplexer 1420, and the bit deinterleaver 1430, and the decoder 1440. The decoder 1440 of FIG. 14 may perform the same function as that of the decoder 1310 of FIG. 13.

Although the first bit remover 1540 is illustrated as a separate element in FIG. 16, the first bit remover 1540 may be included in the decoder 1550.

Also, the decoder 1550 and the desegmenter 1590 may perform the same functions as those of the decoder 1310 and the desegmenter 1320 of FIG. 13.

Since the above-described elements have been described above with reference to FIGS. 13 to 15, a redundant explanation will be omitted.

The demodulator 1510 demodulates a signal which is transmitted from the transmitting apparatus 1000. Specifically, the demodulator 1510 demodulates the received signal and determines values corresponding to the bits mapped onto the constellation points. The values corresponding to the bits mapped onto the constellation points may be LLR values.

The multiplexer 1520 multiplexes the signal output from the demodulator 1510. The signal output from the demodulator 1510 may be LLR values for the bits mapped onto the constellation points.

Specifically, the multiplexer 1520 performs an operation corresponding to the demultiplexer 1050 of FIG. 11, and outputs the LLR values corresponding to the bits mapped onto the constellation points in reverse order of the demultiplexer 1050.

The bit deinterleaver 1530 deinterleaves the signal output from the multiplexer 1520. The signal output from the multiplexer 1520 may be LLR values which are rearranged in order by the multiplexer 1520.

Figure 15:
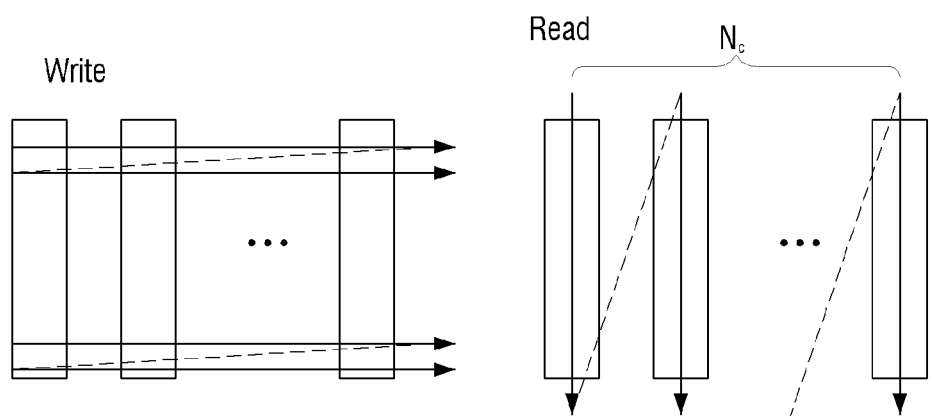
FIG. 15 is a view to illustrate a deinterleaving method according to an exemplary embodiment.

Specifically, the bit deinterleaver 1530 performs an operation corresponding to the bit interleaver 1040 of FIG. 11. That is, the bit deinterleaver 1530 may perform deinterleaving with respect to the LLR values which are rearranged in order by the multiplexer 1520, by writing in order of rows and outputting in order of columns as shown in FIG. 15.

The first bit remover 1540 removes bits from the signal output from the bit deinterleaver 1530. The signal output from the bit deinterleaver 1530 may be deinterleaved LLR values.

Specifically, the first bit remover 1540 may perform an operation corresponding to the second bit inserter 1030 of FIG. 11. That is, the first bit remover 1540 may remove as many as $N_{pad}$ of the LLR values. $N_{pad}$ is calculated using Equation 15 described above. In this case, the locations and number of LLR values removed by the first bit remover 1540 may be determined by the rate controller 1570.

The decoder 1550 may include a depuncturer/deshortener 1551, a parity deinterleaver 1552, a BCH/LDPC decoder 1553, and a second bit remover 1554.

The depuncturer/deshortener 1551 performs depuncturing and deshortening with respect to the signal output from the bit remover 1540. The signal output from the bit remover 1540 may be $N_{pad}$ LLR values which were removed.

Specifically, the depuncturer/deshortener 1551 may perform an operation corresponding to the puncturer 1024 and the bit inserter 1021 of FIG. 11.

That is, the depuncturer/deshortener 1551 inserts LLR values corresponding to the bits that are removed by puncturing of the puncturer 1024. The LLR values corresponding to the bits that are removed by puncturing of the puncturer 1024 may be '0'.

The depuncturer/deshortener 1551 may insert the LLR values corresponding to the zero-value bits inserted by the bit inserter 1021. The LLR values corresponding to the bits inserted by the bit inserter 1021 may be '+∞' or '−∞'.

The locations and number of '0' inserted by the depuncturer/deshortener 1551 and the locations and number of inserted '+∞' or '−∞' may be determined by the rate controller 1570.

The parity deinterleaver 1552 parity-deinterleaves the signal output from the depuncturer/deshortener 1551. The signal output from the depuncturer/deshortener 1551 may be LLR values after LLR values corresponding to the bits removed by puncturing and corresponding to the inserted '0' bits have been inserted.

Specifically, the parity deinterleaver 1552 performs an operation corresponding to the parity interleaver 1023 of FIG. 11. That is, the parity deinterleaver 1552 performs deinterleaving with respect to the LLR values corresponding to the parity bits of the LDPC codeword. However, when the parity interleaver 1023 of FIG. 11 is not used, the parity deinterleaver 1552 may be omitted.

The BCH/LDPC decoder 1553 may perform decoding with respect to the signal output from the parity deinterleaver 1552. The signal output from the parity deinterleaver 1552 may be LLR values after LLR values corresponding to the LDPC parity bits have been deinterleaved.

Specifically, the BCH/LDPC decoder 1553 performs an operation corresponding to the BCH/LDPC encoder 1022 of FIG. 11. That is, the BCH/LDPC decoder 1553 may perform LDPC decoding and BCH decoding using the received LLR values. Accordingly, the BCH/LDPC decoder 1553 may output the segmented L1 signaling.

The second bit remover 1554 removes bits from the signal output from the BCH/LDPC decoder 1553. The signal output from the BCH/LDPC decoder 1553 may be segmented L1 signaling.

Specifically, the second bit remover 1554 performs an operation corresponding to the first bit inserter 1021 of FIG. 11. That is, the second bit remover 1554 may remove the 0 padding bits from the decoded bits, that is, the bits constituting the segmented L1 signaling. In this case, the locations and number of bits to be removed may be determined by the rate controller 1570.

The desegmenter 1560 desegments the signal output from the decoder 1550. The signal output from the decoder 1550 are decoded bits from which the 0 padding bits are removed, and may be segmented L1 signaling from which the 0 padding bits are removed.

Specifically, the desegmenter 1560 performs an operation corresponding to the segmenter 1010 of FIG. 11. That is, the desegmenter 1560 desegments the segmented signaling and generates signaling.

Although not explained, various elements included in the transmitting apparatus 100, 700, 1000 and the receiving apparatus 1300, 1400, 1500 may be implemented as hardware.

Also, the transmitting apparatus 100, 700, 1000 and the receiving apparatus 1300, 1400, 1500 may include a separate memory (not shown) to store the parity check matrix which is used in LDPC encoding and decoding.

Figure 17:
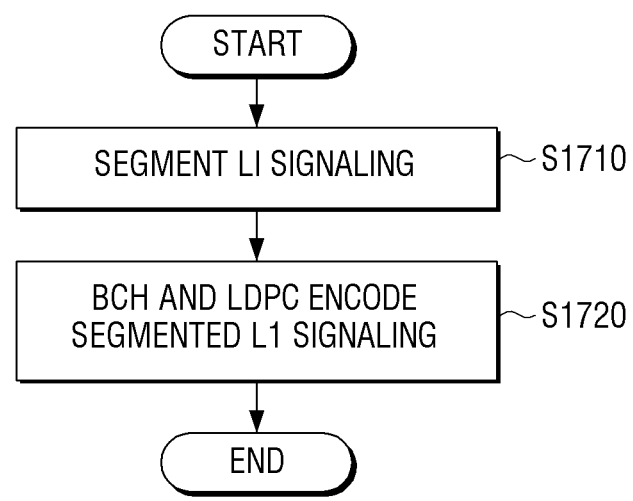
FIG. 17 is a flowchart to illustrate a signal processing method according to an exemplary embodiment.

FIG. 17 is a flowchart to illustrate a signal processing method according to an exemplary embodiment.

First, L1 signaling is segmented (S1710).

BCH and LDPC encoding is performed with respect to each of the segmented L1 signaling (S1720). From the LDPC parity bits added by the LDPC encoding, the number of bits that may be punctured is as many as the number of bits of a predetermined group unit.

Specifically, when the LDPC parity bits are grouped by a predetermined criterion, the predetermined group unit may be an integer multiple of the number of LDPC parity bits included in each group. The predetermined criterion may be determined according to a constant corresponding to an LDPC code rate.

In this case, the bits of the predetermined group unit to be punctured may be calculated using the following equation 17:

$$N_{punc} = \left\lfloor \frac{A \times (K_{bch} - K_{sig}) + B}{M} \right\rfloor \times M \qquad (17)$$

where $N_{punc}$ indicate bits of the predetermined group unit, A is a ratio between the number of bits to be shortened and the number of bits to be punctured, B is a correction value, M is the number of LDPC parity bits included in each group, $K_{bch}$ is a length of an information word in the BCH encoding, and $K_{sig}$ is a length of the segmented L1 signaling.

Zero-value bits are added to the segmented L1 signaling so that an encodable length is obtained, and the L1 signaling to which the zero-value bits are added are encoded.

Also, the signal processing method according to an exemplary embodiment may add zero-value bits to the encoded L1 signaling and may bit interleave the L1 signaling to which the zero-value bits are added using the bit interleaver.

In this case, the zero-value bits may be added so that the length of the encoded L1 signaling is an integer multiple of the number of columns constituting the bit interleaver, and the number of zero-value bits to be added may be calculated using the following equation 18:

$$N_{PAD} = \qquad (18)$$
$$\left\lceil \frac{K_{sig} + P_{bch} + P_{ldpc} - N_{punc}}{N_c} \right\rceil \times N_c - (K_{sig} + P_{bch} + P_{ldpc} - N_{punc})$$

where $N_c$ is the number of columns of the bit interleaver, $K_{sig}$ is a length of an information word in the BCH encoding, $P_{bch}$ is the number of BCH parity bits added by the BCH encoding, $P_{ldpc}$ is the number of LDPC parity bits added by the LDPC encoding, and $N_{punc}$ is the number of punctured LDPC parity bits.

Figure 18:
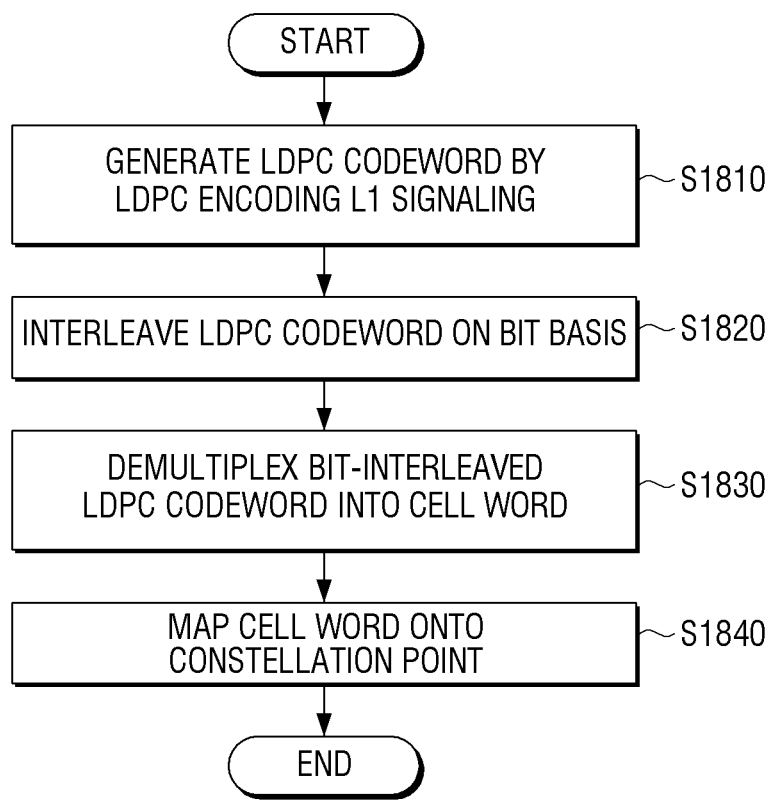
FIG. 18 is a flowchart to illustrate a signal processing method according to an exemplary embodiment.

FIG. 18 is a flowchart to illustrate a signal processing method according to an exemplary embodiment.

First, LDPC encoding is performed with respect to L1 signaling and an LDPC codeword is generated (S1810).

The LDPC codeword is interleaved on a bit basis (S1820).

The bit-interleaved LDPC codeword is demultiplexed into a cell word (S1830), and the cell word is mapped onto a constellation point (S1840).

In this case, the bit-interleaved LDPC codeword may be demultiplexed into the cell word, considering characteristics of the LDPC encoding and a modulation symbol corresponding to the constellation point.

Specifically, the cell word includes bits constituting the modulation symbol, and in this case, the bit-interleaved LDPC codeword may be demultiplexed into the cell word, so that a bit that has a relatively good error correcting ability from among the bits constituting the bit-interleaved LDPC codeword, according to the characteristics of the LDCP encoding, can be equally mapped onto the bit constituting the modulation symbol according to detecting performance of the bits constituting the modulation symbol.

The interleaving may be performed using the bit interleaver, and the bit that has the relatively good error correcting ability is a bit that is relatively located at a front end from among the bits constituting the LDPC codeword, and may be a bit that is written on a column relatively located at the front end from among the plurality of columns constituting the bit interleaver.

Also, the bit-interleaved LDPC codeword may be demultiplexed into the cell word, so that the bit that has the relatively good error correcting ability is equally mapped onto a bit that determines signs of a real number part and an imaginary number part of the constellation point onto which the modulation symbol is mapped, from among the bits constituting the modulation symbol.

Specifically, the method may determine a cell word in which each of the bits constituting the bit-interleaved LDPC codeword is demultiplexed according to a modulation method using the following table.

| Modulation format | QPSK | | | | | | |
|---|---|---|---|---|---|---|---|
| input bit-number di mod N | 0 | 1 | | | | | |
| Output bit-number, e | 0 | 1 | | | | | |
| Modulation format | 16-QAM | | | | | | |
| Input bit-number, di mod N | 0 | 1 | 2 | 3 | | | |
| Output bit-number, e | 0 | 2 | 3 | 1 | | | |
| Modulation format | 64-QAM | | | | | | |
| Input bit-number, di mod N | 0 | 1 | 2 | 3 | 4 | 5 | |
| Output bit-number, e | 0 | 3 | 1 | 5 | 2 | 4 | |
| Modulation format | 256-QAM | | | | | | |
| Input bit-number, di mod N | 0 | 1 | 2 | 3 | 4 | 5 | 6 | 7 |
| Output bit-number, e | 0 | 4 | 6 | 1 | 7 | 3 | 5 | 2 | where the input bit number is an index of each of the bits constituting the bit-interleaved LDPC codeword, and the output bit number is an index of each of the bits constituting the cell word.

The operation of generating the LDPC codeword may LDPC encode the L1 signaling at a code rate of 5/15.

A non-transitory computer readable medium, which stores a program for performing the signal processing methods according to the exemplary embodiments in sequence, may be provided.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB), memory stick, a memory card, and a read only memory (ROM), and may be provided.

Although a bus is not illustrated in the block diagrams of the transmitting apparatus and the receiving apparatus described above, communication between the elements of the transmitting apparatus and the receiving apparatus may be performed though a bus. Also, the transmitting apparatus and the receiving apparatus may further include a processor such as a CPU, a microprocessor, etc. to perform the above-described various operations.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A transmitting apparatus comprising at least one processor configured to implement:
    a segmenter configured to segment Layer 1 (L1) signaling into a plurality of segmented L1 signaling;
    an encoder configured to Low Density Parity-Check (LDPC) encode each of the segmented L1 signaling to generate LDPC parity bits for each of the segmented L1 signaling; and
    a punctures configured to puncture at least part of the LDPC parity bits,
    wherein a number of the LDPC parity bits to be punctured is equal to an integer multiple of a number of bits of a group among a plurality of groups constituting the LDPC parity bits.

2. The transmitting apparatus of claim 1, wherein the predetermined criterion is determined according to a constant corresponding to an LDPC code rate.

3. The transmitting apparatus of claim 1, wherein the encoder calculates the number of the bits to be punctured using a following equation:

$$N_{punc} = \left\lfloor \frac{A \times (K_{bch} - K_{sig}) + B}{M} \right\rfloor \times M,$$

where $N_{punc}$ is the number of the bits of the group, A is a ratio between a number of bits to be shortened and a number of bits to be punctured, B is a correction value, M is a number of LDPC parity bits included in the each group, $K_{bch}$ is a length of an information word in Bose, Chaudhuri, Hocquenghem (BCH) encoding if the BCH encoding is performed prior to the LDPC encoding, and $K_{sig}$ is a length of the segmented L1 signaling.

4. The transmitting apparatus of claim 1, wherein the encoder adds zero-value bits to the segmented L1 signaling so that the L1 signaling has a length encodable by the encoder, and encodes the L1 signaling to which the zero-value bits are added.

5. The transmitting apparatus of claim 1, further comprising:
    a bit inserter configured to add zero-value bits to the encoded L1 signaling; and
    a bit interleaver configured to bit-interleave the L1 signaling to which the zero-value bits are added.

6. The transmitting apparatus of claim 5, wherein the bit inserter adds the zero-value bits so that the length of the encoded L1 signaling is an integer multiple of a number of columns constituting the bit interleaver, and outputs the L1 signaling to which the zero-value bits are added to the bit interleaver.

7. The transmitting apparatus of claim 5, wherein the bit inserter calculates a number of zero-value bits to be added using a following equation:

$$N_{PAD} = \left\lceil \frac{K_{sig} + P_{bch} + P_{ldpc} - N_{punc}}{N_c} \right\rceil \times N_c - (K_{sig} + P_{bch} + P_{ldpc} - N_{punc}),$$

where $N_c$ is a number of columns of the bit interleaver, $K_{sig}$ is a length of an information word in Bose, Chaudhuri, Hocquenghem (BCH) encoding if the BCH encoding is performed prior to the LDPC encoding, $P_{bch}$ is a number of BCH parity bits added by the BCH encoding, $P_{ldpc}$ is a number of LDPC parity bits added by the LDPC encoding, and $N_{punc}$ is a number of punctured LDPC parity bits.

8. A method for processing signals of a transmitting apparatus, the method comprising:
   segmenting Layer 1 (L1) signaling into a plurality of segmented L1 signaling;
   Low Density Parity-Check (LDPC) encoding each of the segmented L1 signaling to generate LDPC parity bits for each of the segmented L1 signaling; and
   puncturing at least part of the LDPC parity bits,
   wherein a number of the LDPC parity bits to be punctured is equal to an integer multiple of a number of bits of a group among a plurality of groups constituting the LDPC parity bits.

9. The method of claim 8, wherein the predetermined criterion is determined according to a constant corresponding to an LDPC code rate.

10. The method of claim 8, wherein the performing the encoding comprises calculating a number of the bits to be punctured using a following equation:

$$N_{punc} = \left\lfloor \frac{A \times (K_{bch} - K_{sig}) + B}{M} \right\rfloor \times M,$$

where $N_{punc}$ is the number of the bits of the group, A is a ratio between a number of bits to be shortened and a number of bits to be punctured, B is a correction value, M is a number of LDPC parity bits included in each group, $K_{bch}$ is a length of an information word in Bose, Chaudhuri, Hocquenghem (BCH) encoding if the BCH encoding is performed prior to the LDPC encoding, and $K_{sig}$ is a length of the segmented L1 signaling.

11. The method of claim 8, wherein the performing the encoding comprises adding zero-value bits to the segmented L1 signaling so that the L1 signaling has an encodable length, and encoding the L1 signaling to which the zero-value bits are added.

12. The method of claim 8, further comprising:
   adding zero-value bits to the encoded L1 signaling; and
   bit-interleaving the L1 signaling to which the zero-value bits are added using a bit interleaver.

13. The method of claim 12, wherein the adding the zero-value bits comprises adding the zero-value bits so that a length of the encoded L1 signaling is an integer multiple of a number of columns constituting the bit interleaver.

14. The method of claim 12, wherein the adding the zero-value bits comprises calculating a number of zero-value bits to be added using a following equation:

$$N_{PAD} = \left\lceil \frac{K_{sig} + P_{bch} + P_{ldpc} - N_{punc}}{N_c} \right\rceil \times N_c - (K_{sig} + P_{bch} + P_{ldpc} - N_{punc}),$$

where $N_c$ is a number of columns of the bit interleaver, $K_{sig}$ is a length of an information word in Bose, Chaudhuri, Hocquenghem (BCH) encoding if the BCH encoding is performed prior to the LDPC encoding, $P_{bch}$ is a number of BCH parity bits added by the BCH encoding, $P_{ldpc}$ is a number of LDPC parity bits added by the LDPC encoding, and $N_{punc}$ is a number of punctured LDPC parity bits.

* * * * *